(12) United States Patent
Arai et al.

(10) Patent No.: US 7,667,454 B2
(45) Date of Patent: Feb. 23, 2010

(54) INSPECTION SYSTEM, INSPECTION METHOD, AND METHOD FOR MANUFACTURING SEMICONDUCTOR DEVICE

(75) Inventors: Yasuyuki Arai, Kanagawa (JP); Yuko Tachimura, Kanagawa (JP); Mai Akiba, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/326,623

(22) Filed: Dec. 2, 2008

(65) Prior Publication Data

US 2009/0087930 A1 Apr. 2, 2009

Related U.S. Application Data

(60) Continuation of application No. 11/862,448, filed on Sep. 27, 2007, now Pat. No. 7,463,049, which is a division of application No. 11/525,516, filed on Sep. 22, 2006, now Pat. No. 7,276,929, which is a division of application No. 11/044,982, filed on Jan. 27, 2005, now Pat. No. 7,112,952.

(30) Foreign Application Priority Data

Jan. 30, 2004 (JP) ............................. 2004-022394

(51) Int. Cl.
H01L 21/00 (2006.01)
H01L 21/66 (2006.01)
H01L 31/84 (2006.01)

(52) U.S. Cl. ...................... 324/158.1; 438/17; 438/149

(58) Field of Classification Search ...................... None
See application file for complete search history.

(56) References Cited

U.S. PATENT DOCUMENTS

| | | | |
|---|---|---|---|
| 5,428,521 A | 6/1995 | Kigawa et al. | |
| 5,854,492 A | 12/1998 | Chinone et al. | |
| 6,104,291 A | 8/2000 | Beauvillier et al. | |
| 6,218,219 B1 | 4/2001 | Yamazaki et al. | |
| 6,236,223 B1 | 5/2001 | Brady et al. | |
| 6,466,007 B1 | 10/2002 | Prazeres da Costa et al. | |

(Continued)

FOREIGN PATENT DOCUMENTS

CN 1387246 A 12/2002

(Continued)

*Primary Examiner*—Paresh Patel
(74) *Attorney, Agent, or Firm*—Cook Alex Ltd.

(57) ABSTRACT

The present invention provides an inspection system of ID chips that can supply a signal or power supply voltage to an ID chip without contact, and can increase throughput of an inspection process and an inspection method using the inspection system. The inspection system according to the present invention includes a plurality of inspection electrodes, a plurality of inspection antennas, a position control unit, a unit for applying voltage to each of the inspection antennas, and a unit for measuring potentials of the inspection electrodes. One feature of the inspection system is that a plurality of ID chips and the plurality of inspection electrodes are overlapped with a certain space therebetween, and the plurality of ID chips and the plurality of inspection antennas are overlapped with a certain space therebetween, and the plurality of ID chips are interposed between the plurality of inspection electrodes and the plurality of inspection antennas by the position control unit.

14 Claims, 15 Drawing Sheets

U.S. PATENT DOCUMENTS

| | | |
|---|---|---|
| 6,509,217 B1 | 1/2003 | Reddy |
| 6,891,391 B2 * | 5/2005 | Hiroki ........................ 324/765 |
| 6,919,215 B2 | 7/2005 | Yamazaki et al. |
| 7,105,365 B2 * | 9/2006 | Hiroki et al. .................. 438/14 |
| 2002/0130675 A1 | 9/2002 | Hiroki |
| 2002/0132383 A1 | 9/2002 | Hiroki et al. |
| 2002/0173060 A1 | 11/2002 | Hiroki |
| 2004/0032563 A1 | 2/2004 | Nakasu et al. |
| 2005/0066246 A1 | 3/2005 | Maltseff et al. |

FOREIGN PATENT DOCUMENTS

| | | |
|---|---|---|
| JP | 2003-107136 | 4/2003 |

* cited by examiner

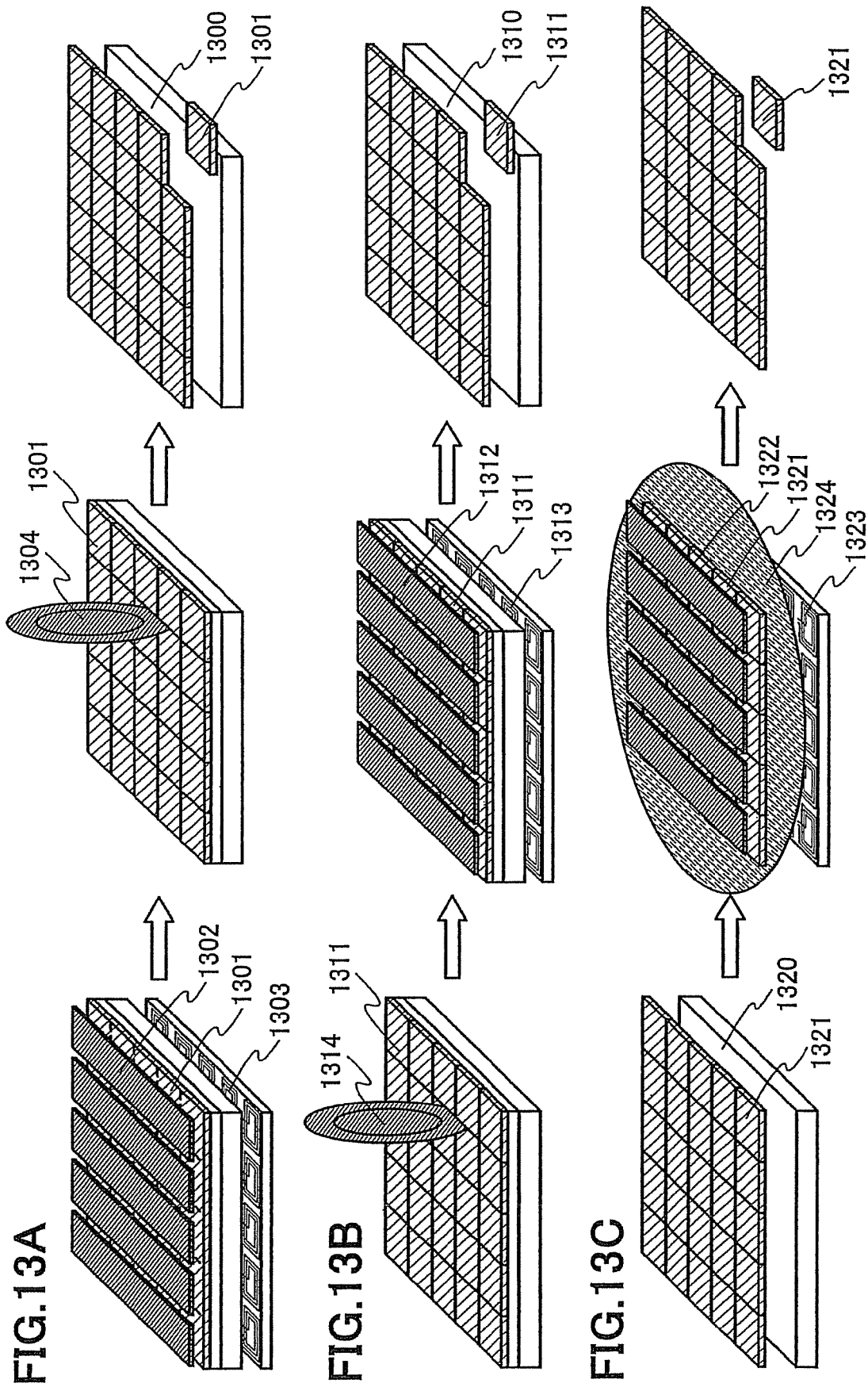

INSPECTION SYSTEM, INSPECTION METHOD, AND METHOD FOR MANUFACTURING SEMICONDUCTOR DEVICE

This application is a continuation of U.S. application Ser. No. 11/862,448, filed on Sep. 27, 2007 now U.S. Pat. No. 7,463,019 which is a divisional of U.S. application Ser. No. 11/525,516, filed on Sep. 22, 2006 (now U.S. Pat. No. 7,276, 929 issued Oct. 2, 2007) which is a divisional of U.S. application Ser. No. 11/044,982, filed on Jan. 27, 2005 (now U.S. Pat. No. 7,112,952 issued Sep. 26, 2006).

BACKGROUND OF THE INVENTION

1. Field of the Invention

The present invention relates to an inspection system (apparatus), and an inspection method of an ID chip that can conduct communication wirelessly, and method for manufacturing a semiconductor device using said inspection method.

2. Description of the Related Art

A semiconductor device typified by an ID chip that can transmit and receive data such as identification information wirelessly has been put into practice in various areas, and the expansion of its market is further anticipated as a communication information terminal of a new mode. An ID chip is called also a wireless tag, a RFID (Radio frequency identification) tag or an IC tag, and one having an integrated circuit (IC chip) formed by using an antenna and a semiconductor substrate is put to practical use at present.

An ID chip is formed through various manufacturing processes and an inspection process is conducted in the end stage of the manufacturing processes. Before being completed as a product, if a defective can be distinguished at an early stage of the steps, later steps of the defective ID chip can be omitted. An inspection process is very effective for reducing the cost.

An inspection process includes an inspection process in which a defective is found out by appearance and an inspection process in which a defective is found out by its electric operation (an electric operation inspection process). If an antenna is already connected to an integrated circuit before isolating ID chips from each other, the electric operation inspection processes are mainly conducted before isolating the plural ID chips by dicing or the like and after packaging the isolated ID chips. If an antenna is already connected to an integrated semiconductor, supply of a signal or power supply voltage to an ID chip is performed without contacting with a reader/writer for an inspection and it can be determined whether an integrated circuit of the ID chip, which is an inspection object, operates normally or not in the above electric operation inspection process.

As described above, an electric operation inspection process before isolating ID chips is effective for reducing the cost in mass-producing ID chips. However, it is an important object in mass-producing ID chips to shorten the time of the electric operation inspection process. As the area of an ID chip becomes smaller and the number of ID chips per substrate is larger, the request for shortening the time needed by an electric operation inspection process is stronger and an inspection system (apparatus) with higher throughput is more desired.

When an inspection system (apparatus) has an anti-collision function that can read signals from a plurality of ID chips, it is thought that the efficiency of an inspection can be enhanced to some extent. However, the number of ID chips that can be inspected by signal-reading of the anti-collision function is about several tens per second. Therefore, for example, if about six hundred thousand ID chips are formed on one substrate and the number of ID chips whose signal can be read per second by the anti-collision function is 30, it takes about five and a half hours to inspect all ID chips formed on the substrate. Therefore, it is difficult to shorten the time of an electric inspection process even if an inspection system (apparatus) having the anti-collision function is used, which leads to prevent TAT (Turnaround time) from being shortened.

SUMMARY OF THE INVENTION

The present invention has been made in view of the above problems. It is an object of the present invention to provide an inspection system (apparatus) for ID chips that can supply a signal or power supply voltage to an ID chip without contact and can increase throughput of an inspection process, and an inspection method using the inspection system (apparatus).

According to the present invention, a plurality of chips (hereinafter, also referred to as an ID chip or a semiconductor device) formed on a substrate are each supplied with a signal or power supply voltage through an antenna and thus the chips are each operated. Output from each of the plural ID chips is read by using electrostatic induction, and thus operating states of the plural ID chips are each inspected.

Specifically, according to an inspection method of the present invention, a plurality of electrodes for inspection (inspection electrodes) are arranged to be overlapped (superimposed) with antennas of the respective plural ID chips with a certain space. An ID chip having an antenna is also called a wireless chip. Then, by using an antenna (inspection antenna) for inspection, a signal or power supply voltage is supplied to each antenna included in the plural ID chips to operate each of the ID chips. When signals are output from the respective plural ID chips, antennas of the respective plural ID chips are applied with voltage and charged. Consequently, inspection electrodes that are overlapped with antennas of the respective plural ID chips among the plurality of inspection electrodes are charged by electrostatic induction.

The amount of stored charges in each of the inspection electrodes is controlled by operating states and the total area of ID chips overlapped with the inspection electrodes. Therefore, the operating state of the ID chip which is overlapped with the inspection electrode can be grasped by grasping the total area of the ID chips which are overlapped with the inspection electrodes and potentials of the inspection electrodes.

According to the present invention, the direction of the plurality of inspection electrodes is turned multiple times while keeping the space between an antenna of the ID chip and the inspection electrode. Specifically, the region where the inspection electrodes and the ID chips are overlapped can be changed by rotating the inspection electrodes while keeping the space between the antenna and the inspection electrode. The potentials of the inspection electrodes are measured every time the direction of the plurality of inspection electrodes is changed. The potentials of the inspection electrodes obtained by measuring a plurality of times, a position of one or a plurality of ID chips overlapping with the inspection electrodes in the measurement and the total area of the ID chips overlapped with the inspection electrodes are stored as data. Note that the total area of the ID chips overlapping with the inspection electrodes can be grasped indirectly with the positions of the inspection electrodes and the ID chips.

Relative value of voltage applied to the antenna of each ID chip can be obtained from the stored data by a reconstruction algorithm (e.g. Fourier transform method) to reproduce distribution of two-dimension from one-dimensional data used in Computed Tomography (CT). In other words, it can be said that value of the voltage applied to the antenna of each ID chip can be read without contact, as a result. From the relative value of voltage applied to the antenna of each ID chip, an operating state of each ID chip can be grasped.

As a reconstruction algorithm, a method of successive approximation, a Fourier transform method using a projection slice theorem, a convolution theorem method and the like are representatively cited. The present invention may employ another reconstruction algorithm besides the methods.

An inspection system (apparatus) using the inspection method comprises a plurality of inspection electrodes, a plurality of inspection antennas, a position control unit (means for controlling a position, an alignment apparatus), a unit (means) for applying voltage to each of the plurality of inspection antennas (voltage supply unit, means for supplying voltage, a voltage supply apparatus), and a unit (means) for measuring potentials of the plurality of inspection electrodes (potential measuring unit, means for measuring potential, a potentials measuring apparatus). In addition, the inspection system (apparatus) may also comprise a unit (means) for analyzing data having measured potentials of the plurality of inspection electrodes as information, and data having positions of the plurality of ID chips and the plurality of inspection electrodes as information, and obtaining data having an operating state of the ID chip as information (analyzing unit, means for analyzing).

The position control unit has a plurality of inspection electrodes, a plurality of inspection antennas, and a function of controlling the positional relationship with the plurality of ID chips which are inspection objects. Specifically, the position control unit can control the positions of the plurality of inspection electrodes, the plurality of inspection antennas and the plurality of ID chips so that the plurality of inspection electrodes face the plurality of inspection antennas with the plurality of ID chips of inspection objects interposed therebetween. The above position control unit has also a function of controlling the direction of the plurality of inspection electrodes while keeping the space between the plurality of inspection electrodes and the plurality of ID chips.

Note that one position control unit or a plurality of position control units may be provided. For example, an inspection system (apparatus) according to the present invention may comprise a plurality of inspection electrodes, a plurality of inspection antennas, a first position control unit having a function of controlling a positional relationship with the plurality of ID chips, and a second position control unit having a function of turning the direction of the plurality of inspection electrodes. In addition, for example, an inspection system (apparatus) may comprise a first position control unit having a function of controlling a positional relationship of a plurality of inspection electrodes and a plurality of ID chips, a second position control unit having a function of controlling a positional relationship of a plurality of antennas and the plurality of ID chips, and a third position control unit having a function of controlling the direction of the plurality of inspection electrodes. In this way, the number of position control units can be determined depending on functions to be shared.

According to the above described structures of the present invention, a signal or power supply voltage can be supplied to an ID chip without contact. Further, as the number of ID chips becomes larger, the number of measuring a potential can be reduced drastically as that of a conventional one, and throughput of an inspection process can be improved.

In the case of an ID chip formed by using a semiconductor substrate, radio waves are blocked and a signal is easily attenuated since the semiconductor substrate serves as a conductor, thus it is difficult to send radio waves uniformly to all antennas of the ID chips. However, in the case of an ID chip formed by an insulating substrate such as a glass substrate or a plastic substrate, which is more difficult to prevent radio waves than a semiconductor substrate, radio waves can be sent more uniformly to all antennas of the ID chip as compared with the case of the ID chip using a semiconductor substrate.

BRIEF DESCRIPTION OF THE DRAWINGS

In the accompanying drawings:

FIGS. 13A to 13C each show a flow of manufacturing steps of an ID chip;

DETAILED DESCRIPTION OF THE INVENTION

Embodiment mode of the present invention will be described with reference to the accompanying drawings hereinafter. The present invention can be implemented in various modes. It is to be understood that various changes and modifications will be apparent to those skilled in the art, unless such changes and modifications depart from the spirit and scope of the present invention hereinafter defined. Therefore, the present invention is not limited to Embodiment Mode.

Figure 1A:
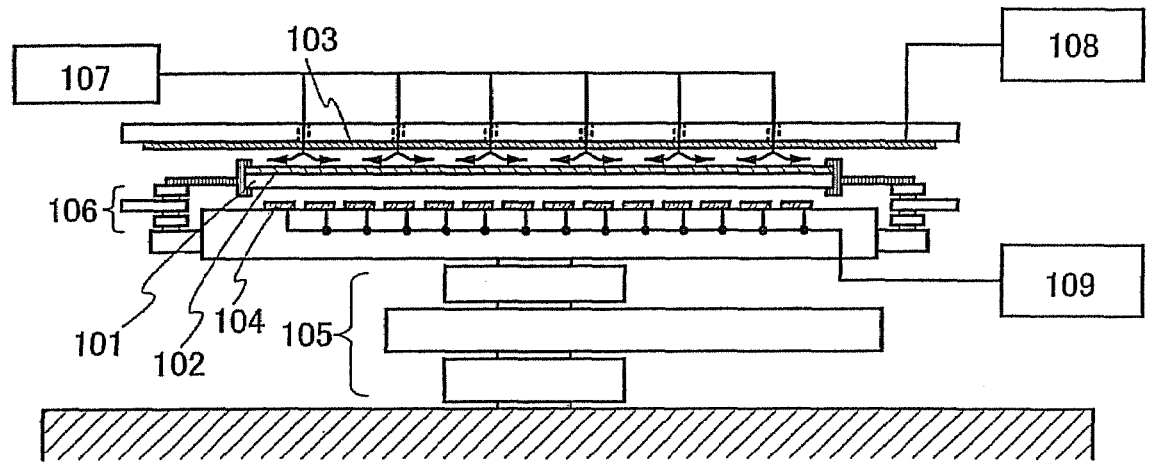
FIGS. 1A and 1B are each a cross-sectional view of an inspection system (apparatus) according to one aspect of the present invention.
Figure 1B:
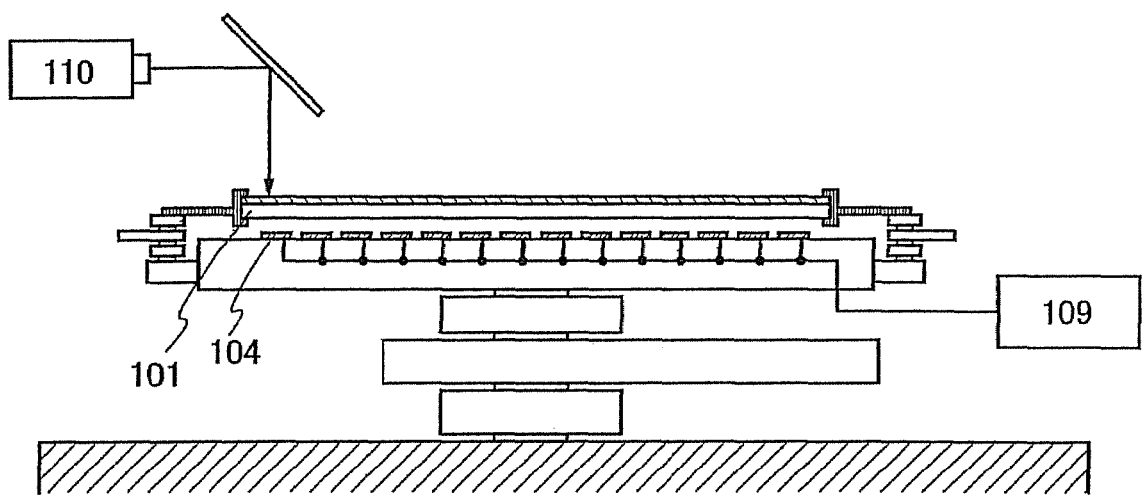

The configuration of an inspection system (apparatus) of the present invention are described with reference to FIGS. 1A and 1B. FIG. 1A is a cross-sectional view showing one mode of an inspection system (apparatus) according to the present invention. In FIG. 1A, reference numeral 101 denotes a substrate that is an inspection object, and a plurality of ID chips 102 are formed on the substrate 101. As shown in FIG. 1A, the inspection system (apparatus) of the present invention includes a plurality of inspection electrodes 103, a plurality of inspection antennas 104, position control units (means for controlling position, alignment apparatuses) 105 to 107, a potential measuring unit (means for measuring potential, a potentials measuring apparatus) 108 and a voltage supply unit (means for supplying voltage, a voltage apply apparatus) 109.

In the inspection system (apparatus) of the present invention shown in FIG. 1A, the inspection electrode 103 and the inspection antenna 104 are overlapped with the substrate 101 that is an inspection object therebetween by using the position control units 105 to 107. Specifically, the position and direction of the inspection antenna 104 in the same plane can be controlled by the position control unit 105. In addition, the relative position and direction of the substrate 101 to the inspection antenna 104 in the same plane and the space between the inspection antenna 104 and the substrate 101 can be controlled by the position control unit 106. The space between the inspection electrode 103 and the substrate 101 can be controlled by the position control unit 107.

Concretely, the position control unit 105 has functions of controlling movements of the inspection antenna 104 in an X-axis direction and in a Y-axis direction that is orthogonal to the X-axis and is in the same plane, and a function of controlling the direction of the inspection antenna 104 in the same plane as the X-axis direction and Y-axis direction.

Concretely, the position control unit 106 has functions of controlling relative movements of the substrate 101 in an X-axis direction, in a Y-axis direction, and in the same plane as the X-axis direction and Y-axis direction, and a function of controlling the space between the inspection antenna 104 and the substrate 101.

FIG. 1A shows an example of the position control unit 107 for controlling the space between the substrate 101 and the inspection electrode 103 by jetting a high-pressure gas to the substrate 101 side like a hovercraft. Note that the space control can be conducted by a certain amount of flow or pressure of fluids without limiting to a high-pressure gas. Note that liquid can be employed as well as gas as the fluids. Besides, a fluid such as gel having viscosity can be employed.

FIG. 1A shows an example of controlling a positional relationship of the inspection electrode 103, the inspection antenna 104 and the substrate 101 with three position control units 105 to 107. However, the number of position control units used in the inspection system (apparatus) of the present invention is not limited to this. The position control unit used in the inspection system (apparatus) of the present invention may have a function of controlling the positional relationship of the plurality of inspection electrodes 103, the plurality of inspection antennas 104 and the plurality of ID chips 102 that are each an inspection object, and thus, the number and the mode thereof are not limited to those shown in FIG. 1A.

Note that the positional relationship control of the inspection antenna 104 and the substrate 101 in the same plane may be conducted with a marker formed on the substrate 101 as a reference. In this case, a camera 110 may be used to gain the position of the marker as shown in FIG. 1B.

A voltage supply unit 109 controls application of alternating voltage to each of the plurality of inspection antennas 104. A signal or power supply voltage can be supplied to the ID chip 102 by applying the alternating voltage to each inspection antenna 104.

The potential measuring unit 108 is equivalent to a unit (means) for measuring potentials of the plurality of inspection electrodes 103. The potentials measured by the potential measuring unit 108 may be variation of the potentials in a particular time or may be a waveform obtained by the change of potential with time. An operating state of the ID chip 102 is included in the potential generated in the inspection electrode 103 as information.

Note that the inspection system (apparatus) of the present invention may have a unit (means) for analyzing data having measured potentials of the plurality of inspection electrodes as information, and data having positions of the plurality of ID chips and the plurality of inspection electrodes as information, and a unit (means) for obtaining data having the operating state of the ID chip as information, in addition to the above described structures.

Figure 2A:
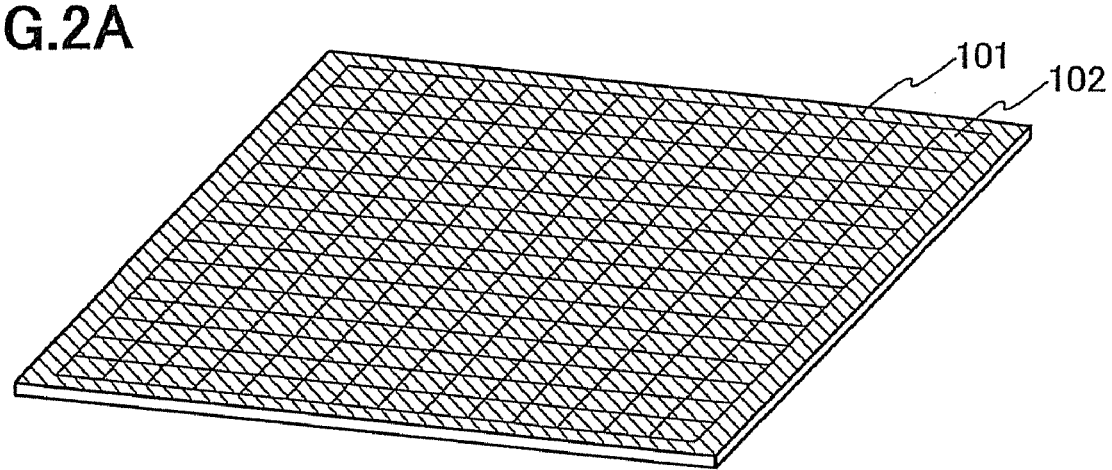
FIGS. 2A and 2B are a perspective view of a substrate 101 and an enlarged view of an ID chip 102, respectively.
Figure 2B:
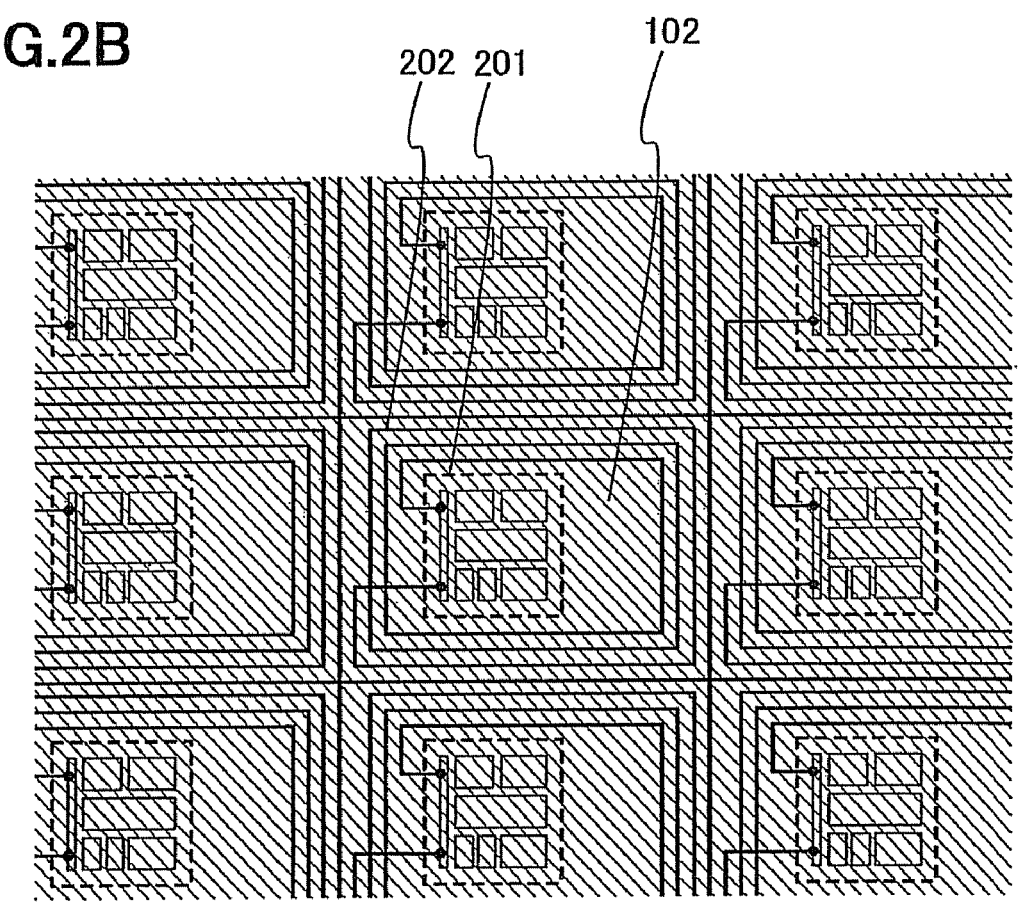

Next, a configuration of the ID chip 102 shown in FIG. 1A is described. FIG. 2A is a perspective view of the substrate 101. A plurality of ID chips 102 are formed over the substrate 101. FIG. 2B is an enlarged view of the ID chip 102. Each ID chip 102 has an integrated circuit 201 and an antenna 202.

A substrate including an insulator, e.g., a glass substrate such as a barium borosilicate glass or an alumino borosilicate glass, or a plastic substrate is more suitable for the substrate 101 that is an inspection object than a substrate that serves as a conductor and easily blocks radio waves, such as a semiconductor substrate or a stainless substrate, since such substrates including an insulator can suppress blocking of radio waves more. In the case of using the substrate 101 having an insulator, the integrated circuit 201 is preferably formed by a semiconductor element having an insulated and isolated thin semiconductor film, e.g., a thin film transistor.

The integrated circuit 201 generates a signal or power supply voltage by rectifying or forming a waveform of alternating voltage applied to the antenna 202. The integrated circuit 201 can conduct various arithmetical processing, reading/writing data or the like by using the generated signal or power supply voltage and apply voltage of a signal obtained as the result thereof to the antenna 202.

Figure 3A:
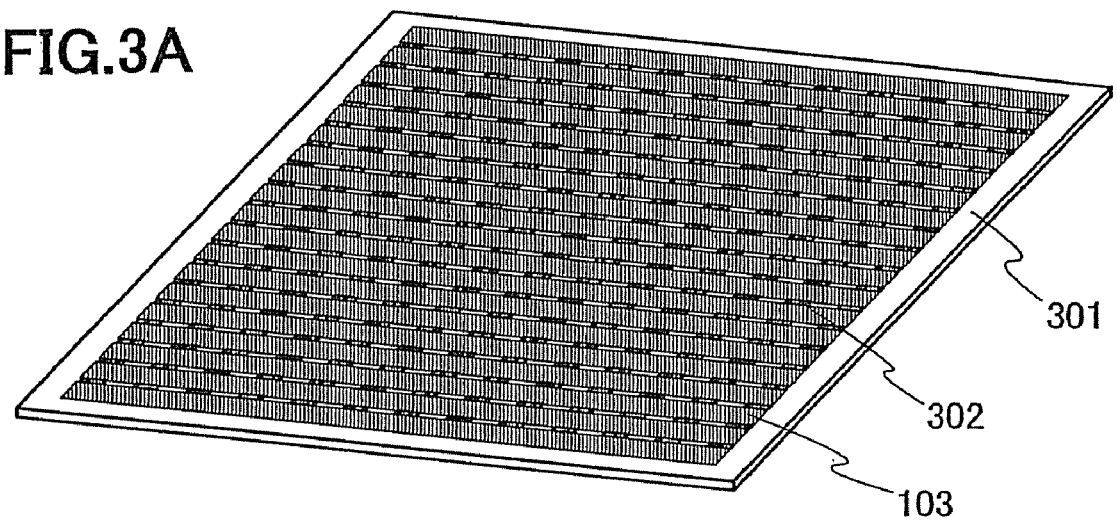
FIGS. 3A and 3B are perspective views of an inspection electrode 103 and an inspection antenna 104, respectively.

Next, a configuration of the inspection electrode 103 shown in FIG. 1A is described. A perspective view of the inspection electrode 103 is shown in FIG. 3A. A plurality of inspection electrodes 103 shown in FIG. 3A each are rectangular and are arranged in parallel in the same plane. Note that in FIG. 3A, a mode that the plurality of inspection electrodes 103 are formed on a flat support medium 301 is shown. As shown in FIG. 1A, a hole 302 for discharging a high-pressure gas to the substrate 101 side is provided in a surface of the support medium 301 in which the inspection electrodes 103 are formed, in the case of controlling the space between the substrate 101 and the inspection electrode 103 by the position control unit 107. Incidentally, if the space between the inspection electrode 103 and the substrate 101 is not controlled by discharging a high-pressure gas, the plurality of inspection electrodes 103 are not necessarily provided on the flat support medium 301, and the positional relationship between the plurality of the inspection electrodes 103 may be fixed.

Figure 3B:
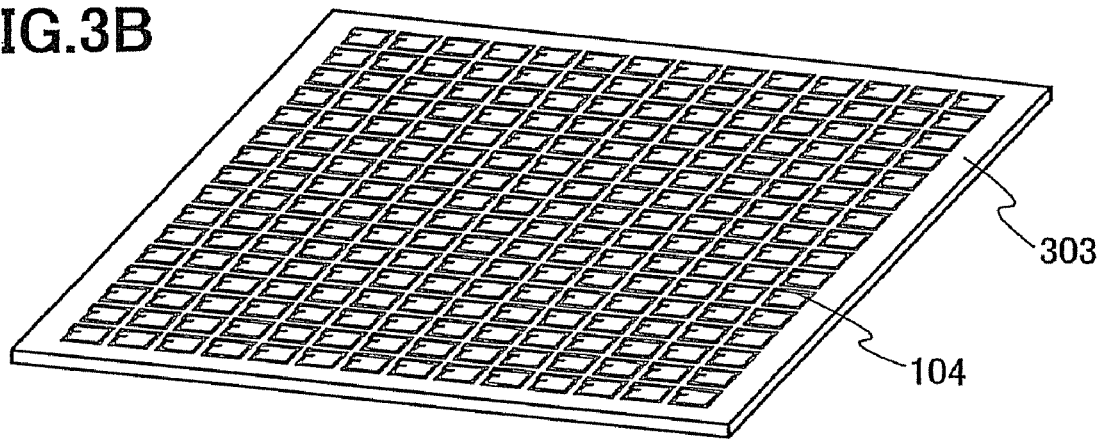

Next, a structure of the inspection antenna 104 shown in FIG. 1A is described. FIG. 3B is a perspective view of the inspection antenna 104. FIG. 3B shows an example in which the plurality of inspection antennas 104 are formed on a support medium 303. The plurality of inspection antennas 104 shown in FIG. 3B are arranged to correspond to each of the plural ID chips that are inspection objects. Each of the plurality of antennas 104 is applied with alternating voltage through the voltage supply unit 109.

Note that FIG. 3B shows an example in which the plurality of inspection antennas 104 correspond to the plurality of ID chips 102 on one to one, but the present invention is not limited to this. One inspection antenna 104 may correspond to two or more ID chips 102, or two or more inspection antennas 104 may correspond to one ID chip 102. When the magnetic flux in the area where an antenna 202 is formed is uniform in each of the ID chips 102, an operating state of the ID chip 102 can be grasped precisely. Thus, the plurality of inspection antennas 104 preferably correspond to the plurality of ID chips 102 on one to one.

Figure 4A:
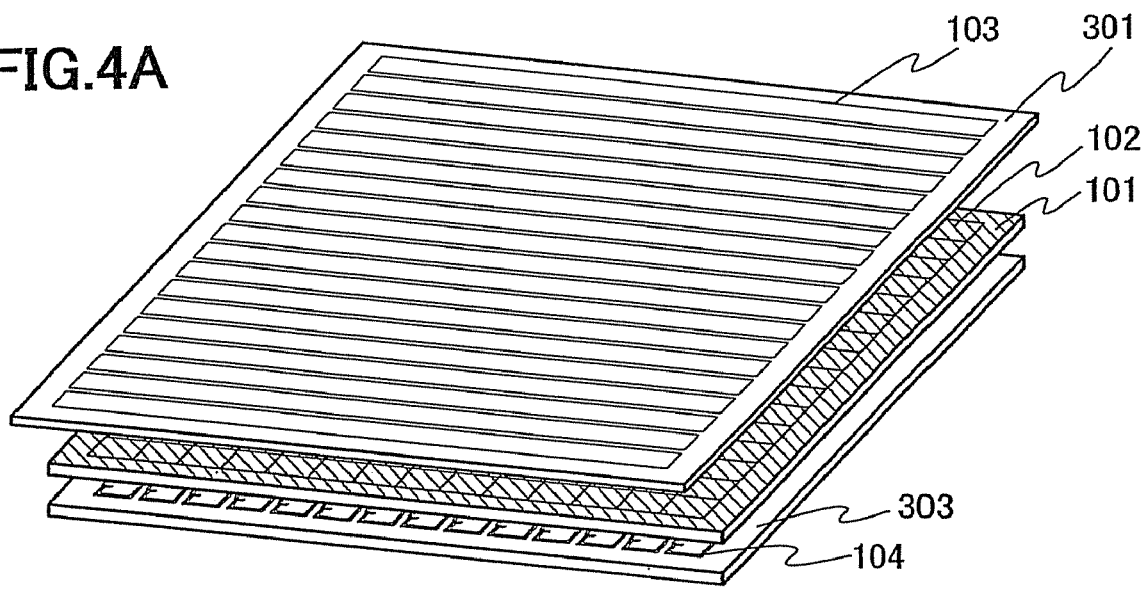
FIGS. 4A and 4B shows a mode in which a substrate 101, a support medium 301 and a support medium 303 are overlapped, and a mode in which the support medium 301 shown in FIG. 4A is rotated, respectively.

In FIG. 4A, the substrate 101 over which the ID chips 102 are formed, the support medium 301 over which the inspection electrodes 103 are formed, and the support medium 303 over which the inspection antennas 104 are formed are superimposed (overlapped). As the space between the antenna of the ID chip 102 and the inspection electrode 103 is preferably smaller and smaller, the operating state of the ID chip 102 can be grasped precisely with the smaller space. Therefore, it is preferable that the space between the antenna of the ID chip 102 and the inspection electrode 103 is as small as possible, as long as it can be controlled. Thus, the substrate 101 and the support medium 301 are overlapped to interpose the ID chips 102 and the inspection electrodes 103 therebetween in FIG. 4A. Note that the inspection electrodes 103 is allowed to be seen through the support medium 303 in order to clarify the positional relationship of the inspection electrode 103 and the ID chip 102 in FIG. 4A.

The substrate 101 is sandwiched between the support medium 301 and the support medium 303; therefore, the ID chip 102 is sandwiched between the inspection electrode 103 and the inspection antenna 104. According to the above structure, a signal or power supply voltage is supplied to the ID chip 102 from the inspection antenna 104 using electromagnetic induction, and thus, a string of signal flow in which voltage is applied to the inspection electrode 103 from the ID chip 102 by electrostatic induction can be formed.

The transmission system of a signal or power supply voltage from the inspection antenna 104 to the ID chip 102 is not limited to an electromagnetic coupling system or an electromagnetic induction system, and may be a microwave system or other transmission systems.

Figure 5A:
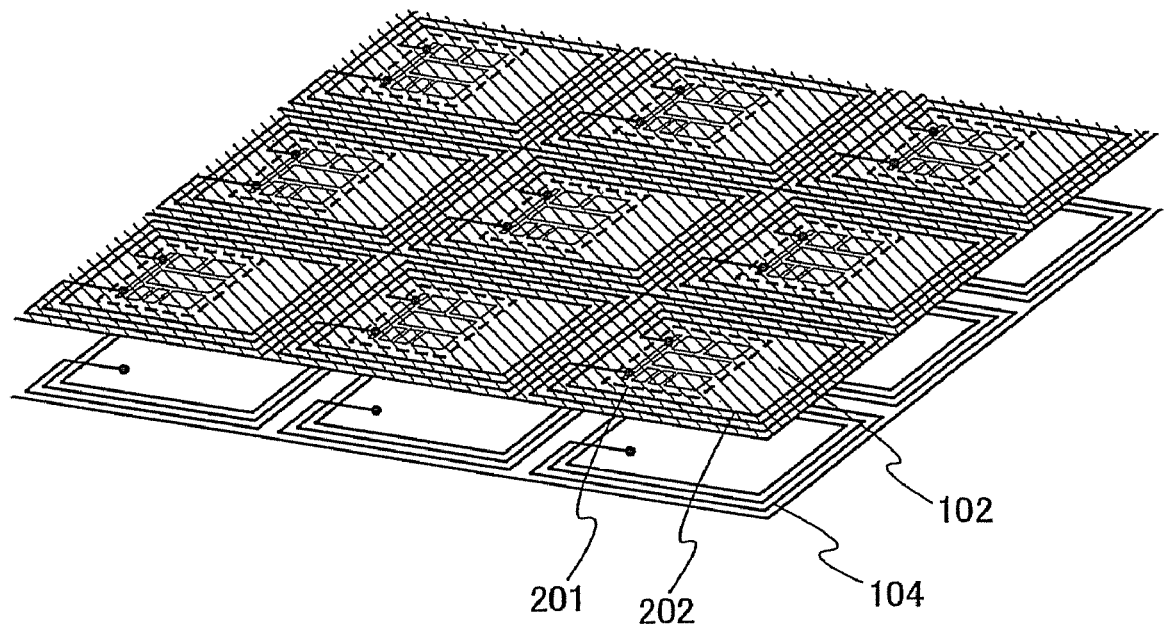
FIGS. 5A and 5B are each an enlarged view of a mode in which an ID chip 102 and an inspection antenna 104 are overlapped.

FIG. 5A is an enlarged view of a mode in which the ID chip 102 is superimposed (overlapped) with the inspection antenna 104, which is shown in FIG. 4A. In FIG. 5A, the substrate 101 is not shown in order to clarify the mode in which the ID chip is overlapped with the inspection antenna 104. As shown in FIG. 2B, the ID chip 102 includes the integrated circuit 201 and the antenna 202, and each antenna 202 is overlapped with the corresponding inspection antenna 104.

Figure 5B:
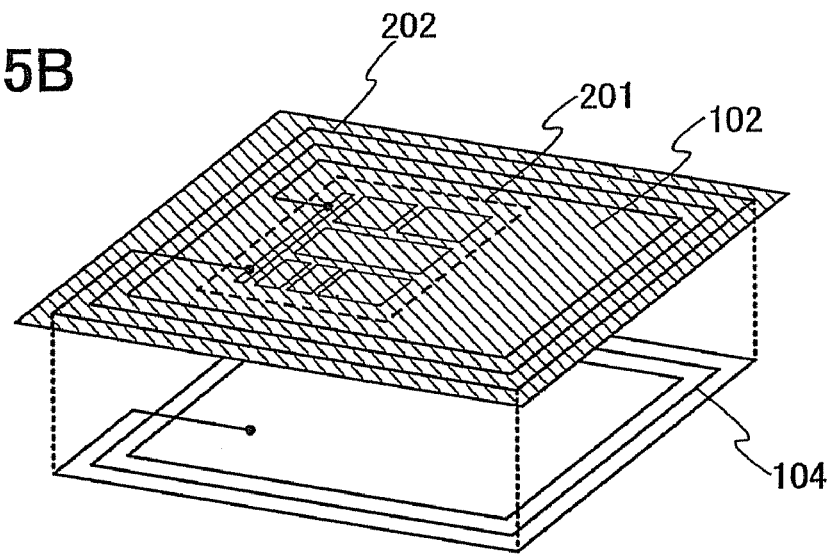

FIG. 5B is a more enlarged view of the ID chip 102 and the inspection antenna 104 shown in FIG. 5A. The inspection antenna 104 and the antenna 202 are arranged with a space enough to supply a signal or power supply voltage using electromagnetic induction from the inspection antenna 104 to the antenna 202.

Actually, the substrate 101 is arranged between the inspection antenna 104 and the antenna 202. However, a glass substrate, a plastic substrate or the like is used as the substrate 101, without using a semiconductor substrate that easily prevents radio waves, so as to uniformly send radio waves to all antennas 202 of the ID chips 102. A glass substrate or a plastic substrate is difficult in blocking radio waves and allows radio waves pass therethrough.

Figure 4B:
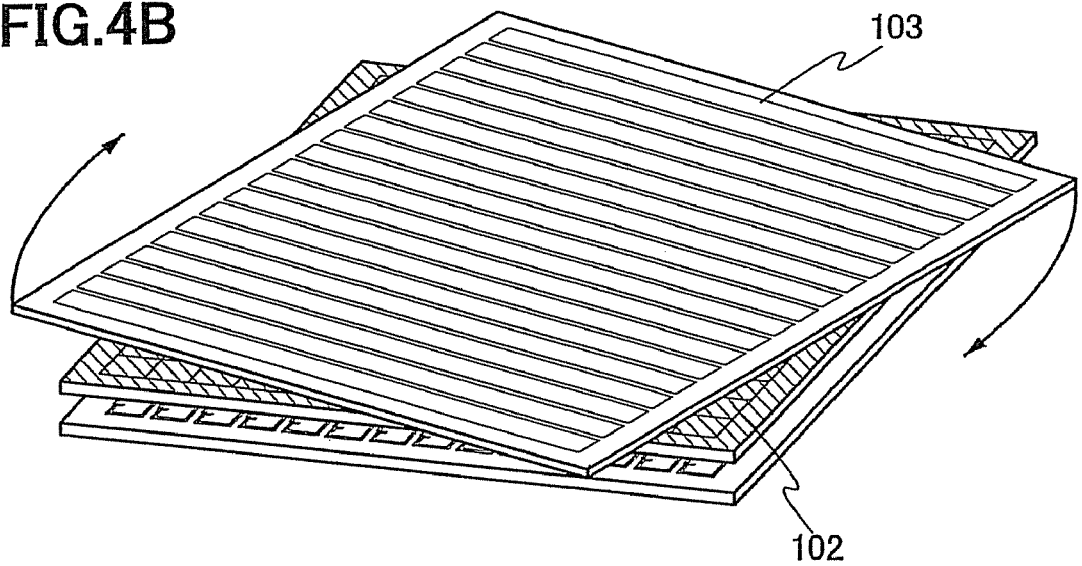

FIG. 4B shows a mode in which the support medium 301 shown in FIG. 4A is rotated. The rotation of the support medium 301 is conducted while keeping the space between the inspection electrode 103 and the ID chip 102. The inspection electrodes 103 are also rotated together with the support medium 301, and the position of the ID chips 102 overlapped with the respective inspection electrodes 103 is changed.

Figure 6A:
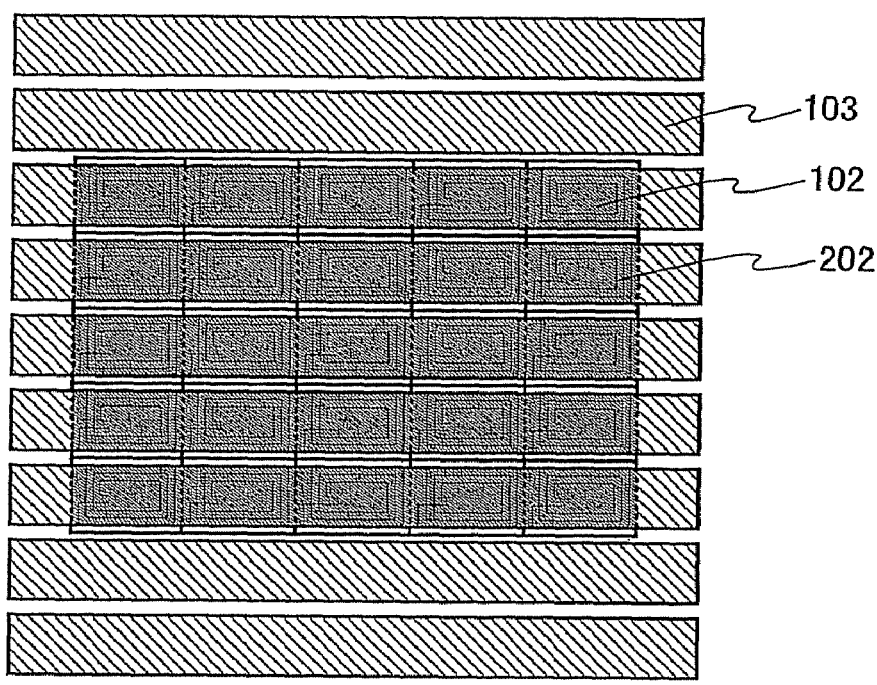
FIGS. 6A and 6B each show a mode in which a plurality of inspection electrodes 103 and a plurality of ID chips 102 are overlapped.
Figure 6B:
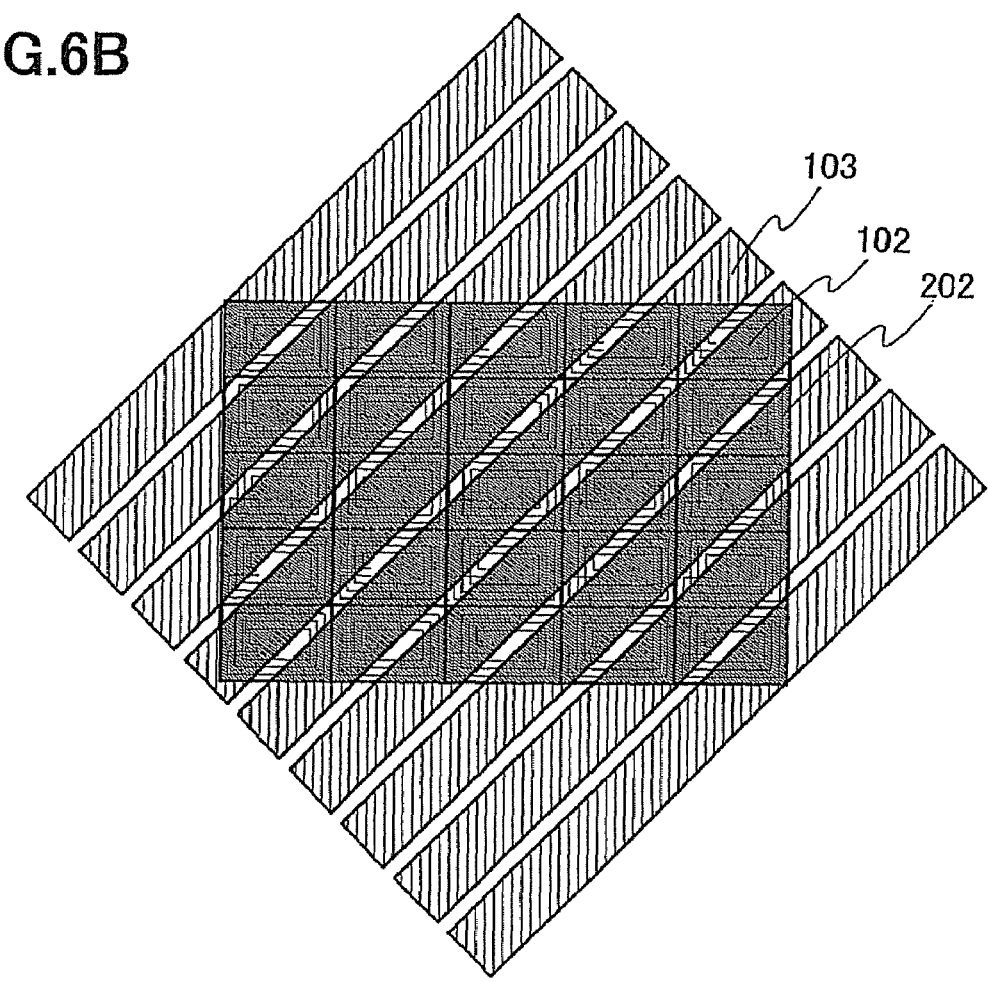

The change of the position of the ID chips 102 overlapped with the inspection electrodes 103 due to the rotation of the inspection electrode 103 is described with reference to FIGS. 6A and 6B. FIGS. 6A and 6B each show an example of twenty-five (5×5) ID chips 102 and nine inspection electrodes 103.

FIG. 6A shows a mode in which the plurality of inspection electrodes 103 and the plurality of ID chips 102 are overlapped. In FIG. 6A, five ID chips 102 are overlapped with one inspection electrode 103. In addition, all inspection electrodes 103 are not overlapped with the ID chips 102, and the inspection electrodes 103 that are not overlapped with the ID chips 102 also exist.

FIG. 6B shows a mode in which the plurality of inspection electrodes 103 are overlapped with the plurality of ID chips 102 in the case where the plurality of inspection electrodes 103 shown in FIG. 6A are rotated. The position of the ID chips 102 overlapped with the inspection electrodes 103 is changed by rotating the plurality of inspection electrodes 103. In other words, the inspection electrodes 103 are each overlapped with the ID chips 102 different from those of FIG. 6A.

As for the alternating voltage to be generated in the respective inspection electrodes 103, the amplitude and the waveform of the alternating voltage are different depending on the number of ID chips 102 overlapped with the inspection electrodes 103, the region where the inspection electrodes 103 are overlapped with the ID chips 102, and the value of the alternating voltage to be applied to the antenna 202 of each ID chip 102. Therefore, the value of the alternating voltage generated in each inspection electrode 103 in FIG. 6A is not always equal to that in FIG. 6B.

It is possible to estimate the number of ID chips 102 overlapped with the inspection electrodes 103 and the region where the ID chips 102 are overlapped with the inspection electrodes 103 in advance on the calculation. The amplitude and the waveform of the alternating voltage applied to each antenna 202 of the ID chips 102 can be calculated on the calculation, or can be obtained also in advance by measuring actually in the case where all ID chips 102 are operated normally. Therefore, it is possible to predict to some extent the amplitude and the waveform of the alternating voltage generated by electrostatic induction in the inspection electrodes 103 in the case where all ID chips 102 are operated normally.

The amplitude and the waveform of the alternating voltage generated in the inspection electrodes 103 in the case where operation defects are included in the ID chips 102 overlapped with the inspection electrodes 103 is different from those of the case where all ID chips 102 are operated normally. Therefore, in the case where the amplitude and the waveform of the alternating voltage generated in the inspection electrodes 103 is different from the amplitude and waveform that are expected, it can be predicted that an operation defect is generated in any of the ID chips 102 overlapped with the inspection electrodes 103.

Figure 7:
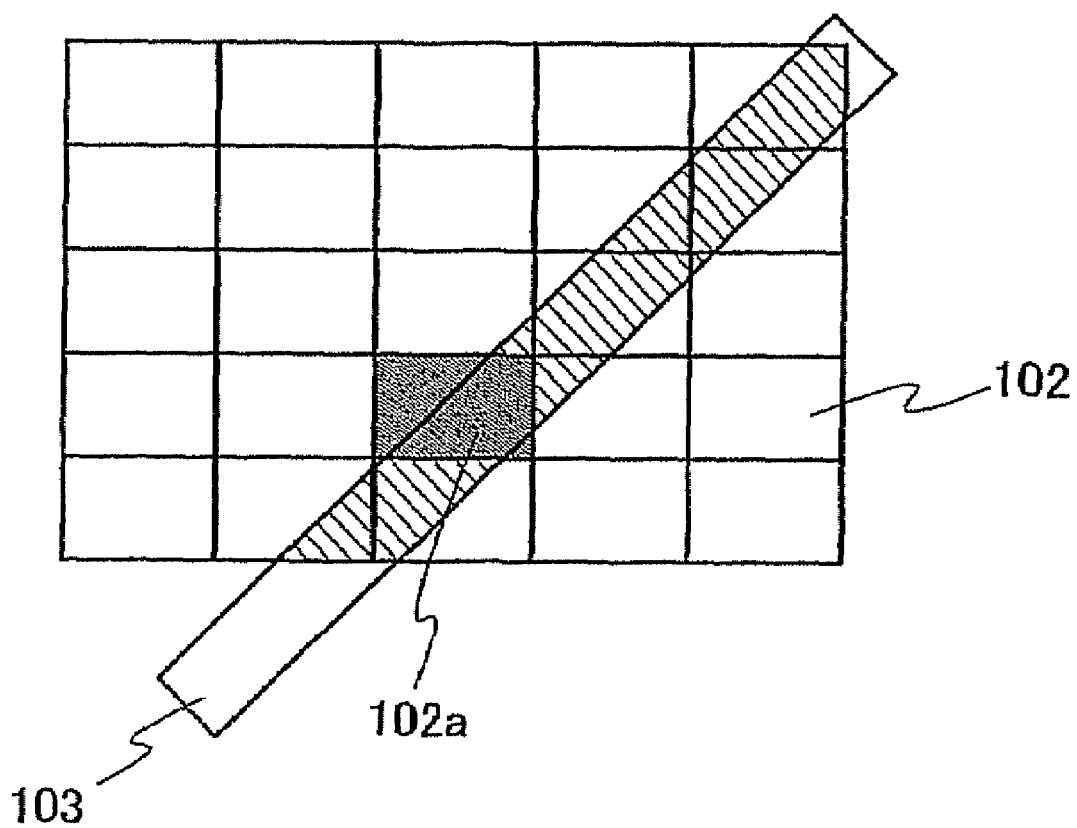
FIG. 7 shows a mode in which one inspection electrode of the inspection electrodes 103 shown in FIG. 6B and an ID chip 102 are overlapped.

FIG. 7 shows a mode where the ID chips 102 are overlapped with one inspection electrode 103 shown in FIG. 6B. It is supposed that an operation defect is caused in an ID chip 102a among the ID chips 102 overlapped with the inspection electrodes 103. As the area of the region where the ID chip 102a whose operation is defective and the inspection electrode 103 are overlapped is larger and larger, the amplitude and the waveform of the alternating voltage generated in the inspection electrodes 103 are more different from the normal amplitude and waveform. Therefore, it is possible to calculate percentage of the ID chips 102 that operates normally, except for the ID chip 102a, among the all ID chips 102 overlapped with one inspection electrode 103.

The position of the inspection electrode 103 with respect to the ID chip 102 is changed multiple times, thereby obtaining percentage of the ID chips 102 that operates normally among all of the ID chips 102 overlapped with one inspection electrode 103 in each position. Therefore, the operating state of each ID chip 102 can be grasped by the percentage of the ID chips 102 that operates normally.

The number of times to change the positional relationship of the inspection electrodes 103 and the ID chips 102 can be determined by a designer as arbitrary. Moreover, the positional relationship of the inspection electrodes 103 and the ID chips 102 in measuring can be set by a designer as arbitrary. It is critically important to determine the positional relationship of the inspection electrode 103 and the ID chips 102 and to set the number of times to change the positional relationship in each measurement so that the operating state of each ID chip 102 can be grasped from the value of alternating voltage of each inspection electrode 103 obtained in all measurements.

Each operating state of the ID chips 102 can be grasped more precisely by considering a layout of the antenna 202 in each of the ID chips 102.

In this embodiment mode, a position of the ID chip 102 overlapped with each inspection electrode 103 is changed by turning the inspection electrode 103, but the present invention is not limited to this. The ID chips 102 may be rotated instead of the inspection electrode 103 as long as the relative positional relationship of the inspection electrodes 103 and the ID chips 102 can be changed. Note that the positional relationship of the inspection antenna 104 and the antenna 202 of the ID chip 102 is fixed even in the case of rotating the ID chip 102.

All ID chips 102 are not required to operate simultaneously in the inspection. For example, ID chips 102 may be operated one by one or may be divided into some groups and operated.

The ID chips 102 may be sorted out into groups of plural rankings based on the operating states thereof, without dividing into two groups depending on the operating states, one group of favorable operating state and the other group of defective operating state. It is possible to determine whether the ID chip 102 is operated normally or not depending on how different an operating state of an ID chip 102 is from the normal operating state of the ID chip 102 by setting a reference by a designer.

Alternating voltage that is to be a reference of a comparison is not necessarily that of the ID chip that is confirmed to be normal. Operating states of ID chips may be confirmed and normality/abnormality of the ID chip may be determined by comparing each alternating voltage generated in plural inspection electrodes. In this case, it is very important to compare each of the alternating voltage, while considering the area of the ID chips overlapped with each inspection electrode. Further, operating states of ID chips may be confirmed and normality/abnormality of the ID chip may be determined by comparing with a value of alternating voltage calculated by simulation.

Embodiment 1

Figure 8:
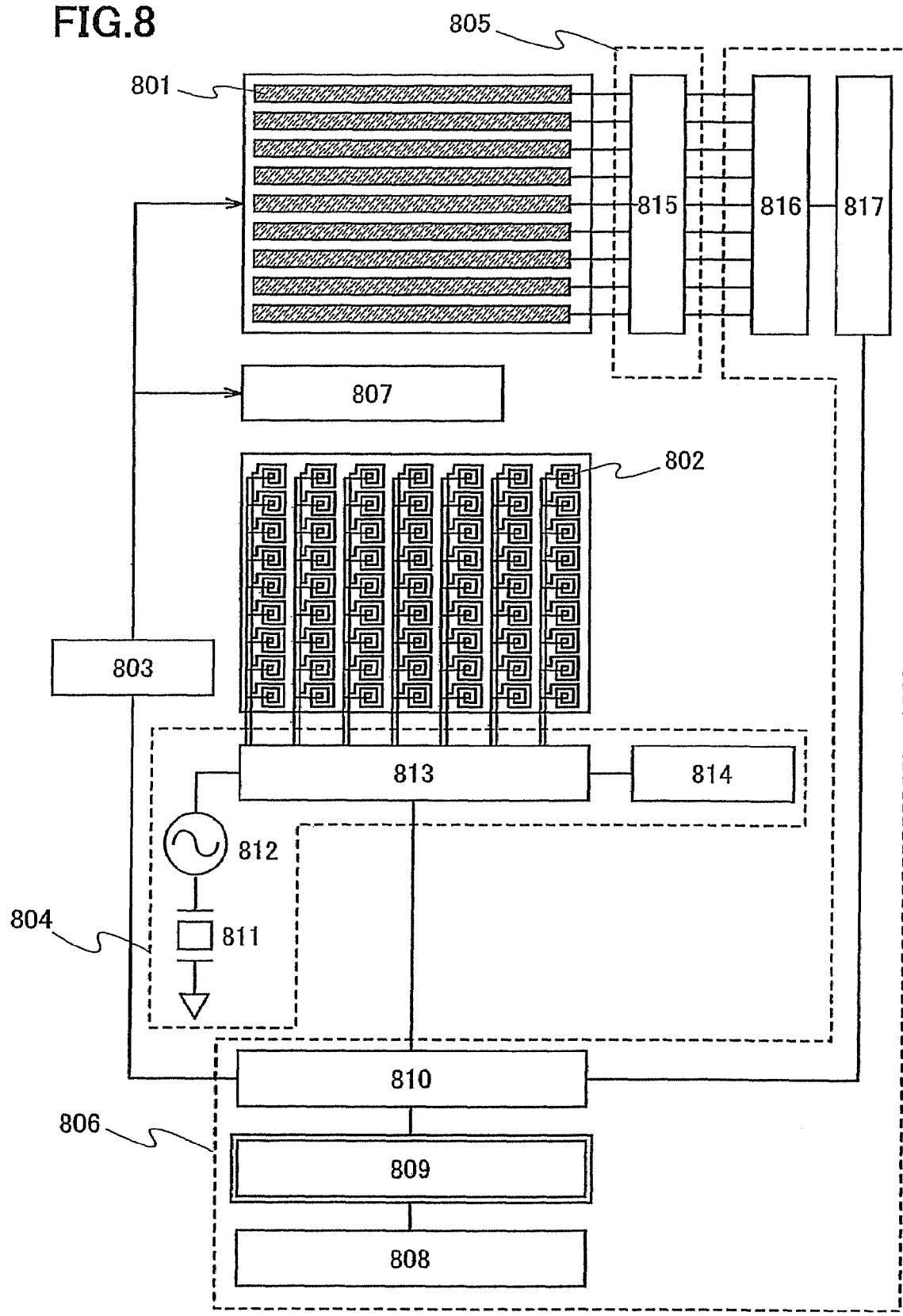
FIG. 8 is a block diagram of a more specific configuration of an inspection system (apparatus) according to one aspect of the present invention.

Embodiment 1 describes a configuration of an inspection system (apparatus) of the present invention more concretely with reference to FIG. 8.

The inspection system (apparatus) of this embodiment shown in FIG. 8 includes a plurality of inspection electrodes 801, a plurality of inspection antennas 802, a position control unit (means for controlling a position, an alignment apparatus) 803, a voltage supply unit (means for supplying a voltage, a voltage apply apparatus) 804 for applying voltage to each of the plurality of inspection antennas 802, and a potential measuring unit (means for measuring potential, a potentials measuring apparatus) 805 for measuring potentials of the plurality of inspection electrodes 801. The inspection system (apparatus) of this embodiment also includes a unit (analyzing unit, means) 806 for analyzing data having potentials of the plurality of inspection electrodes 801 measured by the potential measuring unit 805 as information and data having positions of the plural ID chips and the plural inspection electrodes 801 as information, and for obtaining data including operating states of the ID chips as information. Reference numeral 807 denotes an ID chip that is an inspection object.

In this embodiment, the analyzing unit (means for analyzing) 806 includes a man machine I/F 808, a measuring controller 809, a measuring sequencer 810 and a selection circuit 816 and a signal analyzer 817. The voltage supply unit 804 includes an oscillator 811, a signal source 812, a modulation circuit 813 and an antenna controller 814. A signal processing circuit 815 is used as the potential measuring unit 805 in this embodiment.

Next, operation of the inspection system (apparatus) in this embodiment is described.

A measurement start instruction is inputted to the man-machine I/F 808, and then inputted to the measuring controller 809 as information. The measuring controller 809 inputs an instruction to control the positions of the ID chip 807 that is an inspection object, the inspection antenna 802 and the inspection electrode 801, as information, to the position control unit 803.

An antenna of the ID chip 807 and the inspection antenna 802 are overlapped by the position control unit 803 with a certain space therebetween. In addition, an antenna of the ID chip 807 and the inspection antenna 801 are overlapped by the position control unit 803 with a certain space therebetween.

The measuring controller 809 inputs a measurement start instruction, as information, to the measuring sequencer 810. Thereupon, the measuring sequencer 810 controls the voltage supply unit 804 to apply alternating voltage to the inspection antenna 802. Concretely, the frequency of alternating voltage generated in the oscillator 811 is converted in the signal source 812 and the alternating voltage is supplied to the modulation circuit 813. On the other hand, the antenna controller 814 generates a signal for controlling operation of the ID chip 807 and inputs the signal to the modulation circuit 813. In the modulation circuit 813, the supplied alternating voltage is modulated and supplied to the inspection antenna 802 according to the signal inputted from the antenna controller 814.

A signal and power supply voltage are supplied to the ID chip 807 by electromagnetic induction by supplying alternating voltage to the inspection antenna 802, thereby operating the ID chip 807. When the ID chip 807 operates, alternating voltage is supplied to the inspection electrode 801 from the antenna of the ID chip 807 by electrostatic induction. The alternating voltage supplied to the inspection electrode 801 includes an operating state of the ID chip 807 as information.

The alternating voltage generated by the inspection electrode 801 is supplied to a signal processing circuit 815. The signal processing circuit 815 processes arithmetically a value of the alternating voltage generated by each inspection electrode 801. Specifically, calculated is a difference between alternating voltages on the respective inspection electrodes. The alternating voltage generated by the inspection electrode 801 often includes various noises in some cases. The noise caused by the inspection electrode 801, having comparatively near frequency and voltage, can be removed to some extent by calculating a difference in value between the alternating voltages generated by the inspection electrodes 801. The frequency and voltage of the noise is nearer as the inspection electrodes 801 are closer in position to each other. Consequently, it is preferred to calculate a difference of alternating voltage between the inspection electrodes 801 closer in position to each other.

The alternating current voltage generated by the inspection electrode 801 differs in waveform and amplitude depending on an operating state of the ID chip 807. For this reason, the calculated difference of alternating voltage includes, as information, an operating state of the ID chip 807. Consequently, the signal having, as information, a calculated difference of alternating voltage (operating information signal) includes, as information, an operating state of the ID chip 807. The operating information signal is inputted to the selection circuit 816.

The selection circuit 816 sequentially selects a plurality of inputted operating information signals and inputs them to the signal analyzer 817. In the signal analyzer 817, the inputted operating information signal is amplified, converted to digital by A/D conversion, and processed arithmetically. The A/D conversion is not necessarily conducted, and the arithmetical processing may be conducted in analog. The arithmetical processing is conducted to analyze the operating states of the ID chip 807 overlapped with the inspection electrodes 801 in the measurement. Thus, the content of the arithmetical processing can be selected by a designer as arbitrary.

The operating information signal that has been processed arithmetically is inputted to the measuring controller 809.

By employing the position control unit 803, the positional relationship of the inspection electrode 801 and the ID chip 807 are changed. By repeating the above described operations multiple times, the plurality of operating information signals that have been processed arithmetically are inputted to the measuring controller 809. The measuring controller 809 specifies a pixel state from the position and area percentage of the ID chip 807 overlapped with each inspection electrode 801 and the inputted operation information signal that has been processed arithmetically in each measurement, and further determines a normality/abnormality of the ID chips 807.

Incidentally, the inspection system (apparatus) of the present invention is not limited to the configuration shown in FIG. 8.

Embodiment 2

Figure 9:
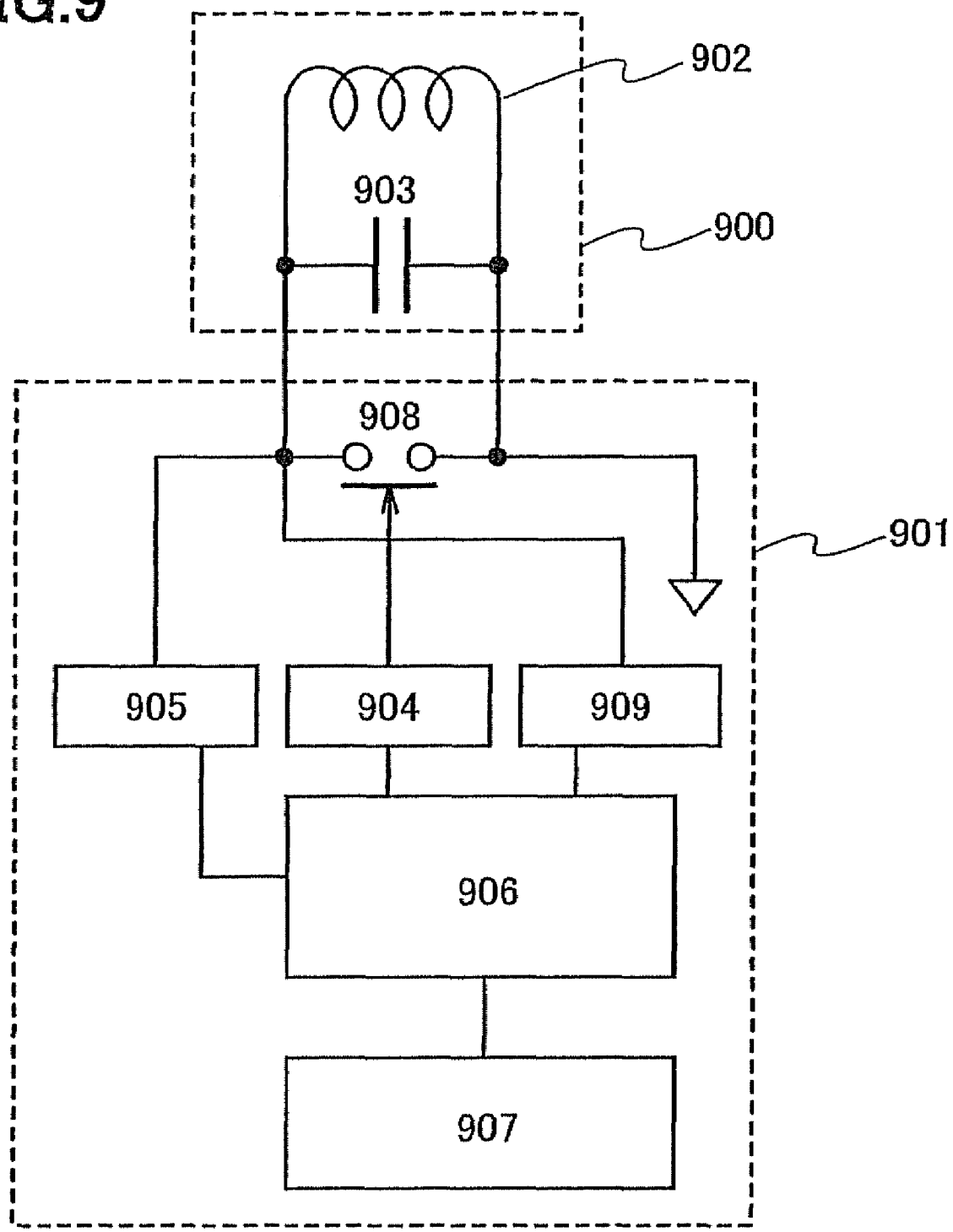
FIG. 9 is a block diagram of a functional configuration of an ID chip.

Embodiment 2 describes one mode of a functional configuration/structure of an ID chip according to the present invention with reference to FIG. 9.

In FIG. 9, reference numeral 900 denotes an antenna, and 901 denotes an integrated circuit. The antenna 900 comprises an antenna coil 902 and a capacitor element 903 formed within the antenna coil 902. The integrated circuit 901 comprises a demodulation circuit 909, a modulation circuit 904, a rectification circuit 905, a microprocessor 906, a memory 907, and a switch 908 for providing load modulation to the antenna 900. In addition, the number of the memory 907 is not limited to one; a plurality of the memories 907 may be provided. As the memory 907, an SRAM, a flash memory, a ROM, an FRAM (registered mark), or the like may be used.

A signal sent from the reader/writer as radio wave is converted into an alternating electric signal by electromagnetic induction in the antenna coil 902. The alternating electric signal is demodulated in the demodulation circuit 909 to be sent to the microprocessor 906 at the subsequent stage. Power supply voltage is produced by using an alternating electric signal in the rectification circuit 905 to be supplied to the microprocessor 906 at the subsequent stage.

Arithmetic processing is carried out according to the inputted signal in the microprocessor 906. The memory 907 stores a program, data or the like used in the microprocessor 906, and can be used as a work place for the arithmetic processing. The signal sent from the microprocessor 906 to the modulation circuit 904 is modulated into an alternating electric signal. The switch 908 can provide load modulation to the antenna coil 902 according to the alternating electric signal from the modulation circuit 904. The reader/writer can read eventually the signal from the microprocessor 906 by receiving the load modulation provided to the antenna coil 902 as radio wave.

The ID chip shown in FIG. 9 is illustrative only as one mode of an ID chip used as an inspection object in the inspection system (apparatus) according to the present invention. The present invention is not limited thereto. A method for transmitting a signal is not limited to an electromagnetic coupling type as shown in FIG. 9, and an electromagnetic induction type, a microwave type, or the other transmitting types may be used.

This embodiment can be freely combined with Embodiment 1.

Embodiment 3

Next, timing of conducting an inspection according to the present invention in a manufacturing process of an ID chip is described. Note that a TFT that is insulated as a semiconductor element is described as an example in this embodiment, but semiconductor elements included in an integrated circuit are not limited to this and various types of circuit elements can be used. A memory element, a diode, a photoelectric conversion element, a resistor element, a coil, a capacitor element, an inductor and the like can be given as a representative example in addition to a TFT.

Figure 10A:
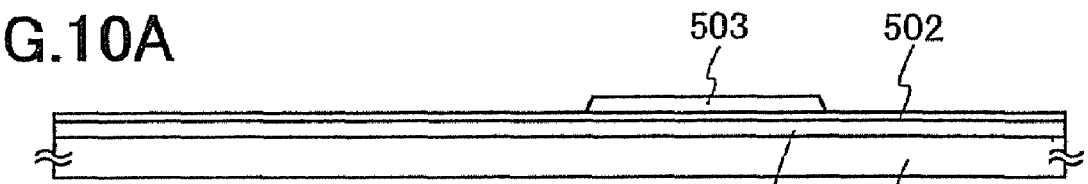
FIGS. 10A to 10D each show a manufacturing step of an ID chip.

As shown in FIG. 10A, a separation layer 501 is formed on a substrate 500 by a sputtering method. A glass substrate such as a barium borosilicate glass or an alumino borosilicate glass, or the like that can resist processing temperature in a later manufacturing step and that prevents radio waves worse than a semiconductor substrate in an inspection step is used as the substrate 500.

A layer mainly containing silicon such as amorphous silicon, polycrystalline silicon, single crystal silicon or micro crystal silicon (including semi-amorphous silicon) can be used for the separation layer 501. The separation layer 501 can be formed by a sputtering method, a plasma CVD method or the like. In this embodiment, an amorphous silicon film is formed to be about 500 nm thick by a sputtering method, and is used as the separation layer 501.

The separation layer 501 is not limited to silicon, and may be formed of a material that can be removed selectively by etching.

A base film 502 is formed on the separation layer 501. The base film 502 is formed in order to prevent an alkaline metal such as Na or an alkaline earth metal contained in the support medium or an adhesive agent from spreading in a semiconductor film used for the semiconductor element and exerting an adverse influence on semiconductor element characteristics in attaching the semiconductor element onto the support medium by an adhesive agent. The base film 502 has also a function of protecting the semiconductor element from an etchant in etching the separation layer 501. The base film 502 is preferably formed of an insulating film such as silicon oxide, silicon nitride or silicon nitride oxide, which is capable of suppressing the spread of an alkaline metal or an alkaline earth metal into the semiconductor film and which can protect a semiconductor element from an etchant used in etching silicon. In this embodiment, a silicon nitride oxide film is formed to be 10 nm to 400 nm thick (preferably, 50 nm to 300 nm) by a plasma CVD method. The base film 502 may be a single layer or a laminated layer of insulating films.

A semiconductor film is formed on the base film 502. The semiconductor film is preferably formed without being exposed to the air after forming the base film 502. The semiconductor film is formed to have a thickness of 20 to 200 nm (preferably, 40 nm to 170 nm). The semiconductor film may be an amorphous semiconductor, a semiamorphous semiconductor or a polycrystalline semiconductor. Silicon germanium as well as silicon can be used for the semiconductor. In the case of using silicon germanium, the concentration thereof is preferably approximately 0.01 to 4.5 atomic %.

The semiconductor film may be crystallized by a know method. As known methods of crystallization, a thermo-crystallization method using an electrically heated oven, a laser crystallization method using laser light, and a lamp annealing crystallization method using an infrared ray are cited. Further, a crystallization method using a catalyst element can be also used. In the case of e.g., laser crystallization, before the laser crystallization, thermal annealing is performed on a semiconductor film for an hour at 500° C. to enhance the tolerance of the semiconductor film to laser light. It is possible to obtain crystals having a large grain size by emitting laser light of second to fourth harmonics of a fundamental wave with a solid-state laser that is capable of continuously oscillating. Typically, it is preferable to use second harmonic (532 nm) or third harmonic (355 nm) of an Nd:YVO$_4$ laser (fundamental wave: 1064 nm). Specifically, laser light emitted from a continuous wave type YVO$_4$ laser is converted to the harmonic with a non-linear optical element to obtain laser light with the output power of 10 W. Preferably, laser light is formed to have a rectangular shape or an elliptical shape in an irradiated surface by using an optical system to irradiate the semiconductor film with, the laser light. On this occasion, an energy density of approximately 0.01 MW/cm$^2$ to 100 MW/cm$^2$ (preferably 0.1 MW/cm$^2$ to 10 MW/cm$^2$) is necessary. The scanning speed thereof is set approximately 10 cm/sec. to 2000 cm/sec. to emit laser light.

The pulsed laser is made to have a repetition rate of 10 MHz or more. This repetition rate may be extremely higher than that of the pulsed laser used usually, which is from several tens to several hundred Hz, to conduct laser crystallization. It is said that it takes several tens to several hundred nsec. to solidify the semiconductor film completely after the semiconductor film is irradiated with the pulsed laser light. Thus, it is possible to irradiate the next pulsed laser light before the semiconductor film is solidified after it have been melted by the laser light and with the repetition rate band. Therefore, since the interface between the solid phase and the liquid phase can be moved continuously in the semiconductor film, the semiconductor film having a crystal grain grown continuously in the scanning direction is formed. Specifically, it is possible to form an aggregation of crystal grains each of which has a width of 10 to 30 μm in the scanning direction and a width of approximately 1 to 5 μm in the direction perpendicular to the scanning direction. It is also possible to form a semiconductor film having almost no crystal grain boundaries at least in the channel direction of the TFT by forming a crystal grain of a single crystal extending long in the scanning direction.

As for the laser crystallization, laser light of the fundamental wave of a continuous wave laser and laser light of the harmonic of a continuous wave laser may be irradiated in parallel, or laser light of the fundamental wave of a continuous wave laser and laser light of the harmonic of a pulsed laser may be irradiated in parallel.

Laser light may be emitted in an inert gas atmosphere such as a rare gas or nitrogen. Thus, unevenness in a surface of a semiconductor due to the laser irradiation can be suppressed, and fluctuation on a threshold value due to fluctuation on the interface state density can be suppressed.

A semiconductor film having more enhanced crystallinity is formed by irradiating the semiconductor film with the laser light as described above. Note that a polycrystalline semiconductor may be formed in advance by a sputtering method, a plasma CVD method, a thermal CVD method or the like.

The semiconductor film is crystallized in this embodiment, but an amorphous silicon film or a microcrystalline semiconductor film may be used in the next process without performing the crystallization. A TFT using an amorphous semiconductor or a microcrystalline semiconductor needs fewer manufacturing steps than a TFT using a polycrystalline semiconductor, and thus, has advantageous effects of reducing costs and enhancing yield.

A semiamorphous semiconductor has an intermediate structure between an amorphous structure and a crystalline structure (including a single crystalline structure, and a polycrystalline structure), and a third state that is stable with respect to free energy. Such a sermiamorphous semiconductor includes a short range order and lattice distortion, and is crystalline. Crystal grains of 0.5 nm to 20 nm in size cab be contained and dispersed in a non-single crystal semiconductor. As for the semiamorphous semiconductor, the Raman spectrum shifts to the lower side of a wave number of 520 cm$^{-1}$, and a diffraction peak of (111) and (220) derived from a silicon crystal lattice is observed in x-ray diffraction. Further, the semiamorphous semiconductor contains hydrogen or halogen of 1 atom % or more for terminating a dangling bond. Herein, the semiamorphous semiconductor is referred to as an SAS for convenience. When a rare gas element such as helium, argon, krypton, or neon is mixed into an SAS (semiamorphous semiconductor), the lattice distortion is more increased and the stability is thus enhanced, thereby obtaining an excellent semiamorphous semiconductor (SAS).

Figure 10B:
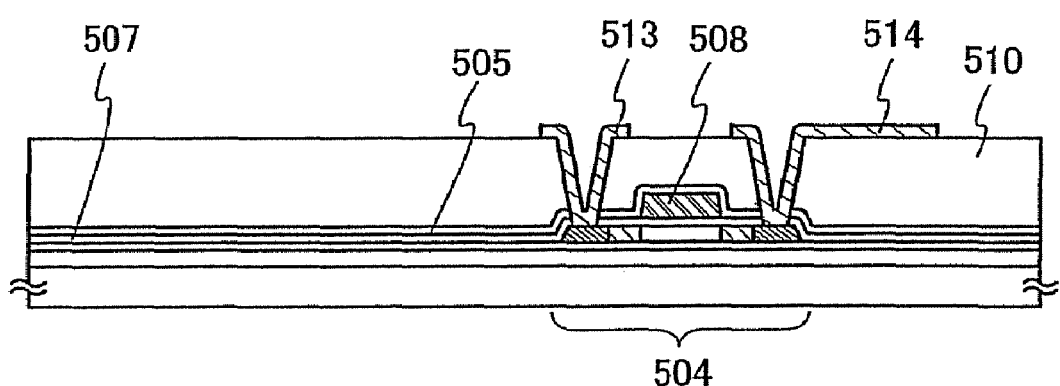

Then, as shown in FIG. 10A, the semiconductor film is patterned to form an island-like semiconductor film 503. Various semiconductor elements as typified by a TFT are formed using the island-like semiconductor film 503 as shown in FIG. 10B. In FIG. 10B, the island-like semiconductor film 503 is in contact with the base film 502, but an electrode, an insulating film, or the like may be formed between the base film 502 and the island-like semiconductor film 503, in some semiconductor elements. For example, in the case of a bottom gate TFT that is one of the semiconductor elements, a gate electrode and a gate insulating film are formed between the base film 502 and the island-like semiconductor film 503.

In FIG. 10B, a top gate TFT 504 is formed using the island-like semiconductor film 503. Specifically, a gate insulating film 507 is formed so as to cover the island-like semiconductor film 503. Then, a conductive film is formed over the gate insulating film 507 and patterned to form a gate electrode 508. Next, impurities imparting n-type conductivity are added to the island-like semiconductor film 503 by using the gate electrode 508 or resist that is formed and patterned as a mask to form a source region, a drain region, an LDD (Lightly Doped Drain) region and the like. Here, the TFT 504 is n-type, but impurities imparting p-type conductivity are added in the case of using a p-type TFT. According to the above-described process, the TFT 504 can be formed.

Moreover, a heat treatment may be performed in the atmosphere including hydrogen in the range of 3 to 100% at temperatures ranging from 300 to 450° C. for 1 to 12 hours to hydrogenate the island-like semiconductor film 503 after forming the gate insulating film 507. As another hydrogenation method, plasma hydrogenation (using hydrogen excited by plasma) may be conducted. In this hydrogenation process, the dangling bond can be terminated by the hydrogen excited thermally. Even when defects are formed in a semiconductor film by bending a support medium after a semiconductor element is attached to the flexible support medium in a later step, the defects can be terminated by hydrogen contained in the semiconductor film by setting the hydrogen concentration in the semiconductor film to $1\times10^{19}$ to $1\times10^{22}$ atoms/cm$^3$, preferably $1\times10^{19}$ to $5\times10^{20}$ atoms/cm$^3$ by the hydrogenation. Halogen may be contained in the semiconductor film to terminate the defects.

Note that a method for manufacturing a TFT is not limited to the above described structure.

A passivation film 505 is formed to cover the TFT 504. The passivation film 505 can prevent an alkaline metal or an alkaline earth metal from entering the TFT 504. A silicon nitride film or a silicon nitride oxide film is preferably used for the passivation film 505. According to the structure, it is possible to prevent more an alkaline metal such as Na or an alkaline earth metal from spreading in a semiconductor film used for the semiconductor element and exerting an adverse influence on semiconductor element characteristics, since the TFT 504 is covered with the base film 502 and the passivation film 505.

A first interlayer insulating film 510 is formed to cover the passivation film 505. After a contact hole is formed in the gate insulating film 507, the passivation film 505 and the first interlayer insulating film 510, wirings 513 and 514 to connect to the TFT 504 through the contact hole are formed to be in contact with the first interlayer insulating film 510.

Figure 10C:
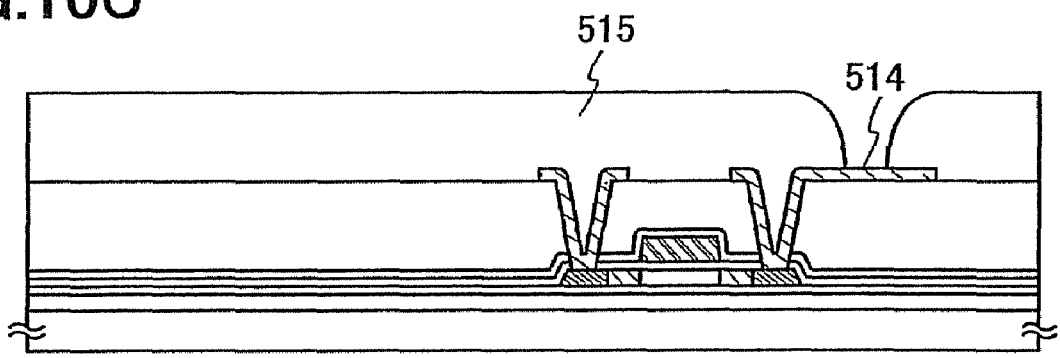

As shown in FIG. 10C, a second interlayer insulating film 515 is formed over the first interlayer insulating film 510. The second interlayer insulating film 515 is formed so that an opening portion is formed in a position where a part of the wiring 514 is exposed. The first interlayer insulating film 510 and the second interlayer insulating film 515 may be formed of an organic resin film, an inorganic insulating film, an insulating film that is formed of a siloxane based material as a start material and includes Si—O—Si bonding (hereinafter a siloxane based insulating film), and the like. The siloxane based insulating film may include at least one element selected from fluorine, an alkyl group, and aromatic hydrocarbon as the substituent, in addition to a hydrogen substituent.

Figure 10D:
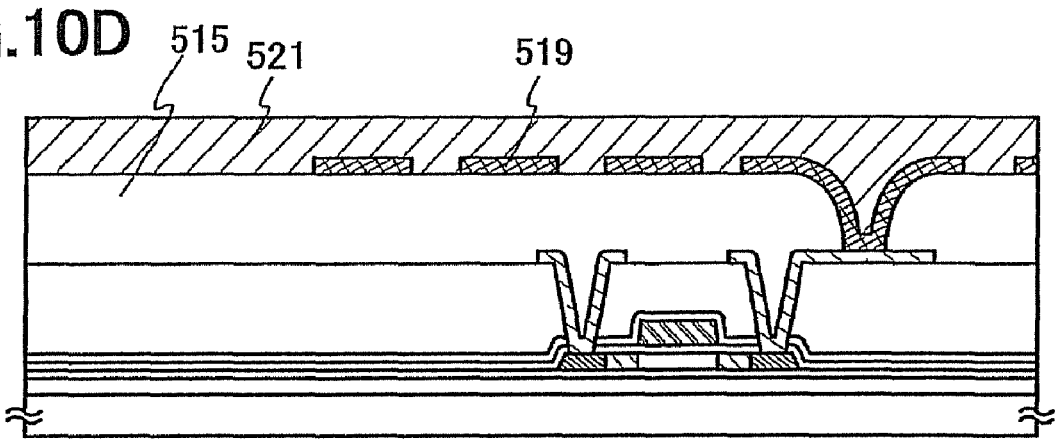

Next, as shown in FIG. 10D, an antenna 519 is formed on the second interlayer insulating film 515. The antenna 519 can be formed by using a conductive material containing one or a plurality of metal and metal alloy of such as Ag, Au, Cu, Pd Cr, Mo, Ti, Ta, W, and Al. The antenna 519 is connected to the wiring 514. Note that the antenna 519 is directly connected to the wiring 514 in FIG. 10D, however, the ID chip of the present invention is not limited to this structure. The antenna 519 and the wiring 514 may be connected by using a wiring formed separately, for example.

The antenna 519 can be formed by using a printing method, a photolithography method, a deposition method, a droplet discharging method or the like. In this embodiment, the antenna 519 is formed of a single layer conductive film, however, the antenna 519 may be formed of a lamination of a plurality of conductive films.

The droplet discharging method is a method for forming a predetermined pattern by discharging droplets containing a predetermined compound from a minute orifice, which includes an ink-jetting method. The printing method includes a screen-printing method, an offset printing method and the like. By using the printing method or the droplet discharging method, the antenna 519 can be formed without using a mask for light-exposure. Moreover, the droplet discharging method and the printing method do not waste a material which is removed by etching in the photolithography method. As an expensive mask for light-exposure is not required to be used, the cost spent for manufacturing ID chips can be suppressed.

In the case of using the droplet discharging method or the printing method, conductive particles obtained by coating Cu with Ag can be used as well, for example. In the case of forming the antenna 519 using the droplet discharging method, it is preferable to perform treatment on a surface of the second interlayer insulating film 515 for enhancing adhesion of the antenna 519.

As a method for enhancing the adhesion, there are cited, for example, a method for attaching a metal or a metal compound which can enhance the adhesion of a conductive film or an insulating film by a catalytic activity onto a surface of the second interlayer insulating film 520, a method for attaching an organic insulating film which has high adhesion property with a conductive film or an insulating film to be formed onto the surface of the second interlayer insulating film 515, a method for modulating a surface property by performing a plasma treatment in an atmospheric pressure or a low pressure onto the surface of the second interlayer insulating film 515. As the metal which has high adhesion with the conductive film or the insulating film is, for example, titanium, titanium oxide, or 3d reduction element such as Sc, Ti, V, Cr, Mn, Fe, Co, Ni, Cu, and Zn. As the metal compound, oxide, nitride, oxynitride and the like of the above-described metals are used. As the organic insulating film, polyimide, siloxane based insulating film and the like are used, for example.

In the case where the metal or the metal compound attached onto the second interlayer insulating film 515 is conductive, sheet resistance thereof is controlled so that the antenna can operate normally. Specifically, the average thickness of the conductive metal or metal compound may be controlled to be 1 to 10 nm or the metal or the metal compound may be partially or wholly insulated by oxidization, for example. Alternatively, the attached metal or metal compound may be selectively removed by etching except for in a region which requires high adhesion property. Otherwise, the metal or the metal compound may be selectively attached only onto a specific region by using the droplet discharging method, the printing method, a sol-gel process and the like instead of attached onto a whole surface of the substrate in advance. The metal or the metal compound do not have to be in a state of a completely continuous film in the surface of the second interlayer insulating film 515, but may be dispersed to some extent.

After forming the antenna 519, a protective layer 521 is formed over the second interlayer insulating film 515 so as to cover the antenna 519. The protective layer 521 is formed by using a material which can protect the antenna 519 when removing the separation layer 501 by etching. For example, the protective layer 521 can be formed by applying resin such as epoxy, acrylate, and silicon which is soluble in water or alcohols.

In this embodiment, aqueous resin (TOA GOSEI CO., LTD.: VL-WSH L10) is applied by spin coating to 30 μm thick, exposed to light for two minutes for temporary curing, then, its back is exposed to UV rays for 2.5 minutes, and its surface is exposed for 10 minutes to be fully cured, namely light-exposure is conducted for 12.5 minutes. Consequently, the protective layer 521 is formed. In the case of stacking a plurality of organic resin, there may be a case where the stacked organic resins melt depending on the solvent during application or baking, or where the adhesion property becomes too high. Therefore, in case of forming both the second interlayer insulating film 515 and the protective layer 521 of organic resin which is soluble in the same solvent, it is preferable to form an inorganic insulating film (a $SiN_X$ film, a $SiN_XO_Y$ film, an $AlN_X$ film, or an $AlN_XO_Y$ film) to cover the second interlayer insulating film 515 for smoothly removing the protective film 521 in the subsequent process.

Figure 11A:
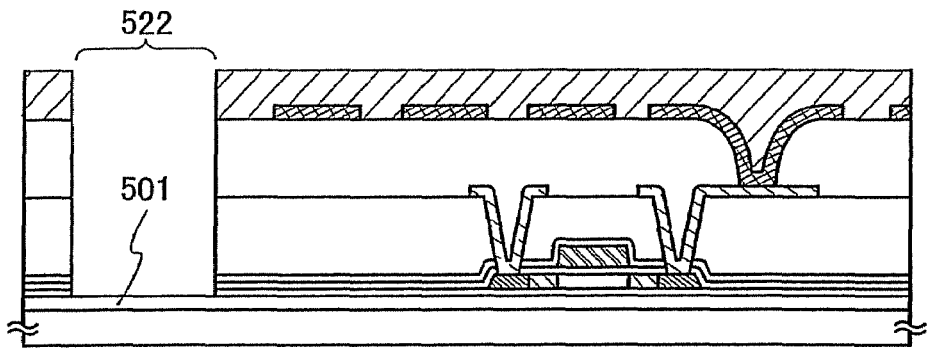
FIGS. 11A to 11C each show a manufacturing step of an ID chip.

As shown in FIG. 11A, a groove 522 is formed for isolating ID chips. The groove 522 is only required to be formed so that the separation layer 501 is exposed. The groove 522 can be formed by dicing, scribing or the like. In the case where the ID chips formed on the substrate 500 are not required to isolate, the groove 522 is not necessarily formed.

Figure 11B:
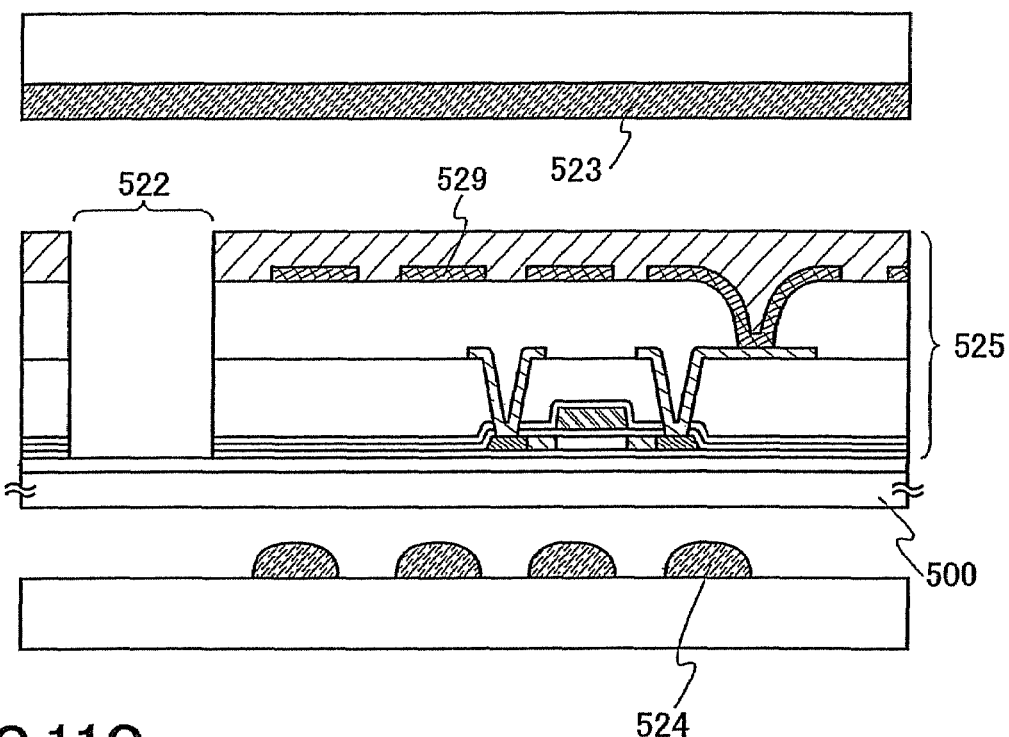

As shown in FIG. 11 B, whether an ID chip operates normally or not is inspected. Reference numeral 523 denotes an inspection electrode and 524 denotes an inspection antenna. An ID chip 525 is sandwiched between the inspection electrode 523 and the inspection antenna 524 and an antenna 529 is sandwiched between the substrate 500 and the inspection electrode 523.

Figure 11C:
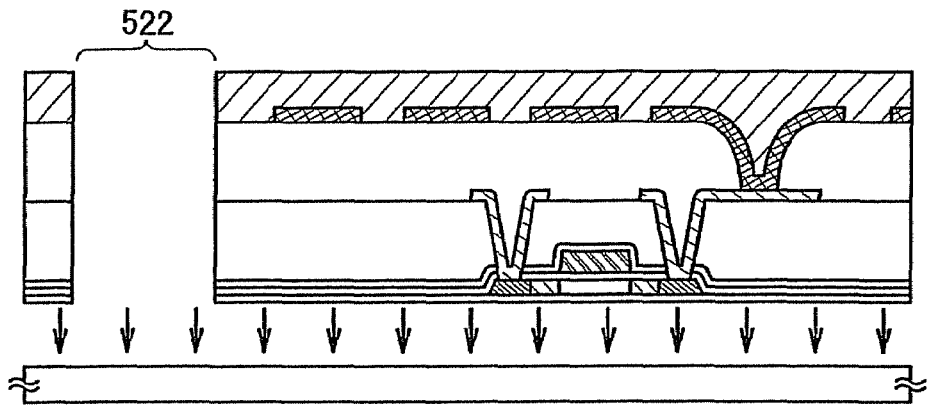

As shown in FIG. 11C, when the inspection is finished, the separation layer 501 is removed by etching. In this embodiment, halogenated fluoride is used as an etching as, which is introduced from the groove 522. In this embodiment, the etching is performed using e.g., $ClF_3$ (chlorine trifluoride) at a temperature of 350° C. with a flow rate of 300 sccm and air pressure of 6 Torr for 3 hours. A gas obtained by mixing nitrogen in $ClF_3$ gas may be used as well. By using the halogenated fluoride such as $ClF_3$, the separation layer 501 is selectively etched and the substrate 500 can be separated from the TFT 504. Note that the halogenated fluoride may be either a gas or liquid.

Figure 12:
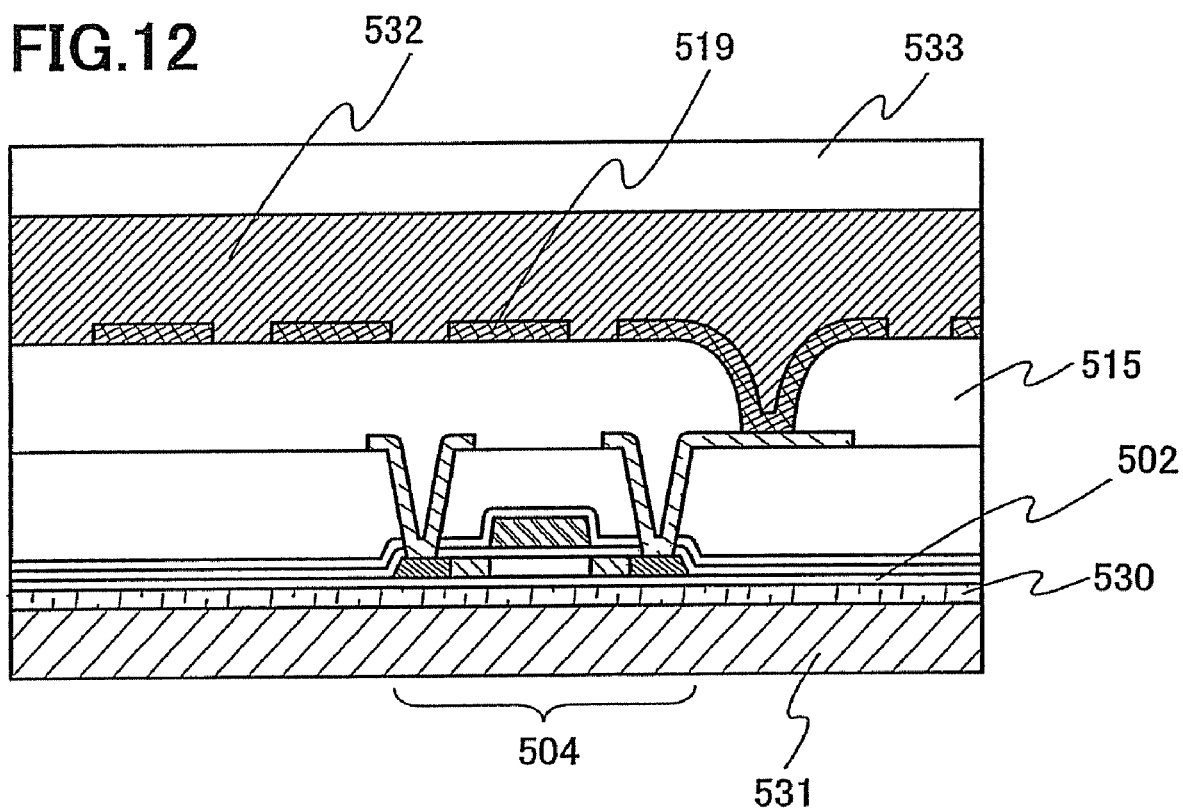
FIG. 12 shows a manufacturing step of an ID chip.

As shown in FIG. 12, the separated TFT 504 and antenna 519 are attached to the support medium 531 by using an adhesive agent 530. A material which can attach the support medium 531 and the base film 502 is used for the adhesive agent 530. Moreover, for the adhesive agent 530, for example, various curable adhesive agents such as a reactive curable adhesive agent, a thermosetting adhesive agent, a photo-curable adhesive agent such as an ultraviolet curable adhesive agent, and an anaerobic adhesive agent can be used.

For the support medium 531, a flexible organic material such as paper and plastic can be used. Alternatively, a flexible inorganic material may also be used for the support medium 531. ARTON (manufactured by JSR) formed of poly nor-bornene having a polar group can be used as the plastic substrate. Polyester represented by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, acrylonitrile butadiene styrene resin, poly vinyl chloride, polypropylene, poly vinyl acetate, acryl resin and the like can be used. It is preferable that the support medium 531 has a high degree of heat conductivity of about 2 to 30 W/mK for dispersing the heat generated in the thin film integrated circuit.

In addition, as shown in FIG. 12, after removing the protective layer 521, the adhesive agent 532 is applied over the second interlayer insulating film 515 so as to cover the antenna 519, then a cover material 533 is attached thereto. The cover material 533 can be formed by using a flexible organic material such as paper and plastic similarly to the support medium 531. For the adhesive agent 532, a material which can adhere the cover material 533, the second interlayer insulating film 520, and the antenna 519. For the adhesion 532, for example, various curable adhesive agents such as a photo-curable adhesive agent such as a reactive curable adhesive agent, a thermosetting adhesive agent or an ultraviolet curable adhesive agent, and an anaerobic adhesive agent can be used.

Through each of the aforementioned steps, an ID chip is completed. According to the aforementioned manufacturing method, a thin film integrated circuit having a total thickness of 0.3 to 3 μm, typically about 2 μm, which is considerably thin can be formed between the support medium 531 and the cover material 533. The thickness of the integrated circuit includes a thickness of each insulating film and interlayer insulating film formed between the adhesive agents 530 and 532 as well as a thickness of the semiconductor element itself. Further, the integrated circuit of the ID chip can be formed to occupy an area of 5 mm or less at one side, or preferably about 0.3 to 4 mm at one side.

By providing the integrated circuit at a position close to the center between the support medium 531 and the cover material 533, the mechanical strength of the ID chip can be enhanced. In specific, provided that a distance between the support medium 531 and the cover material 533 is d, it is preferable to control the thickness of the adhesive agents 530 and 532 so that a distance between the support medium 531 and the center in a direction of the thickness of the integrated circuit satisfies the following formula 1.

$$\frac{1}{2}d - 30 \ \mu m < x < \frac{1}{2}d + 30 \ \mu m. \quad \text{[Formula 1]}$$

The semiconductor film, the insulating film or the like used in the ID chip is incused with a serial number. If a third person gets illegally a stolen ID chip in which data is not memorized in a ROM, it is possible to trace the route by the serial number to some extent. In this case, it is more efficient to incuse a serial number in a part in which the serial number can be deleted, only when the semiconductor device is tore down irreparably and cannot be repaired.

A method for separating an integrated circuit from the substrate 500 is not limited to the method for etching a silicon film as shown in this embodiment, and various methods can be employed. For example, a metal oxide film is provided between a high heat resistant substrate and an integrated circuit, and the metal oxide film is crystallized to be weak so as to separate the integrated circuit. For example, a separation layer can be broken by laser irradiation to separate an integrated circuit from a substrate. For, example, a substrate on which an integrated circuit is formed can be removed mechanically or removed by etching with a solution or a gas to separate an integrated circuit from a substrate.

When organic resin is used as the adhesive agent 530 in contact with the base film 502 to ensure flexibility of the ID chip, it is possible to prevent an alkaline metal such as Na or an alkaline earth metal from spreading into the semiconductor film from the organic resin by using a silicon nitride film or a silicon nitride oxide film as the base film 502.

In the case where the support medium of the ID chip attached to a surface of an object is curved to have a curved surface shown by moving a bus bar of a conical surface, a cylindrical surface or the like since the surface of the object is curved, it is preferable that the direction of the bus bar is the same as a movement direction of carriers of a TFT. According to the structure, adverse affects due to bending of a support medium to TFT characteristics can be prevented. The area percentage in an integrated circuit occupied by the island-like semiconductor film is set 1 to 30%, thereby suppressing adverse affects to TFT characteristics even when a support medium is bent.

Note that an inspection process of the present invention is not necessarily conducted at the timing described in this embodiment. The inspection process can be conducted at any time, as long as the antenna and the integrated circuit are completed.

This embodiment describes the example in which the antenna and the integrated circuit are formed on the same substrate. However, the present invention is not limited to this structure. An antenna formed on a substrate may be attached to an integrated circuit formed on another substrate.

In general, a lot of ID chips use radio waves with a frequency of 13.56 MHz or 2.45 GHz. Therefore, an ID chip is required to be formed so as to detect radio waves with these frequencies to expand the versatility thereof.

The ID chip of this embodiment has the advantage that radio waves are less shielded therein as compared with in an ID chip formed by using a semiconductor substrate, and thus signal attenuation due to shielded radio waves can be prevented.

Without requiring a semiconductor substrate, the cost of the ID chip can be drastically reduced. For example, the case of using a silicon substrate with a diameter of 12 inches is compared with the case of using a glass substrate with a size of 730×920 mm$^2$. The silicon substrate has an area of about 73000 mm$^2$ whereas the glass substrate has an area of about 672000 mm$^2$, that is, the glass substrate is about 9.2 times as large as the silicon substrate. On the glass substrate with an area of about 672000 mm$^2$, about 672000 ID chips each having an area of 1 μm square can be formed when taking no account of margin for cutting the substrate, which is about 9.2 times as many as the ID chips formed on the silicon substrate. In the case of using the glass substrate with a size of 730×920 mm$^2$, which requires fewer manufacturing steps, facility investment cost for mass production of ID chips can be reduced to one-third of that in the case of using the silicon substrate with a diameter of 12 inches. Further, according to the present invention, after an integrated circuit is separated from a glass substrate, the glass substrate can be reused. Therefore, the cost in the case of using the glass substrate can be significantly reduced as compared with in the case of using the silicon substrate, even when taking into account the cost of compensating for a broken glass substrate or cleaning a surface of the glass substrate. Even if a glass substrate is not reused and discarded, a glass substrate with a size of 730×920 mm$^2$ costs about half as much as a silicon substrate with a diameter of 12 inches. As a result, it is apparent that the cost of an ID chip can be reduced drastically.

Thus, an ID chip using a glass substrate with a size of 730×920 mm$^2$ costs only about one-thirtieth as much as an ID chip using a silicon substrate with a diameter of 12 inches. Since the ID chip is expected to be used as the disposable one, the ID chip of the present invention that can cost much less is quite effective for such application.

This embodiment can be freely combined with Embodiment 1 or Embodiment 2.

Embodiment 4

Embodiment 4 describes an example of timing of an inspection process.

An inspection process for inspecting an electric operation of an ID chip can be conducted at any time, as long as an antenna and an integrated circuit are completed respectively and the antenna and the integrated circuit are connected electrically. Therefore, the inspection process can be conducted before and/or after isolating ID chips, and/or after separating an ID chip from a substrate.

FIG. 13A schematically shows a manufacturing step flow of an ID chip in the case of an inspection process before isolating ID chips. In FIG. 13A, the operating state of an ID chip 1301 is inspected by using the inspection electrode 1302 and the inspection antenna coil 1303 before isolating the ID chips 1301. When the inspection is finished, the ID chips 1301 are isolated by using a blade 1304 and then, the ID chips 1301 are separated from a substrate 1300 by etching.

FIG. 13B schematically shows a manufacturing step flow of an ID chip in the case of an inspection process after isolating ID chips. In FIG. 13B, the operating state of an ID chip 1311 is inspected by using the inspection electrode 1312 and the inspection antenna coil 1313 after isolating the ID chips 1311 by a blade 1314. When the inspection is finished, the ID chips 1311 are separated from a substrate 1310 by etching.

FIG. 13C schematically shows a manufacturing step flow of an ID chip in the case of an inspection process after separating ID chips. In FIG. 13C, isolated ID chips 1321 are separated from a substrate 1320 by etching, and are attached to a tape 1324. The ID chips 1321 may be attached to the tape 1324 before the separation. The operating state of the ID chip 1321 is inspected by using an inspection electrode 1322 and an inspection antenna coil 1323 with the tape 1324 attached thereto. When the inspection is finished, the ID chips 1321 are separated from the tape 1324. A material whose viscosity is reduced by ultraviolet rays irradiation is used for the tape 1324, thereby preventing the ID chips 1321 from being applied with excessive force in the separation.

As shown in FIG. 13C, even when a semiconductor substrate is used as the substrate 1320, radio waves can be sent to all antennas of ID chips uniformly in the inspection process, in the case of conducting the inspection after separating the ID chips 1321.

This embodiment describes the step of separating the substrate after isolating ID chips, but the present invention is not limited to this structure. For example, dicing may be conducted to isolate ID chips with the ID chips attached to a tape after separating the substrate. In this case, the inspection process may be conducted before or after isolating ID chips attached to a tape.

This embodiment can be freely combined with any of Embodiments 1 to 3.

Embodiment 5

Embodiment 5 describes a method of determining a defective ID chip after an inspection process.

Figure 14A:
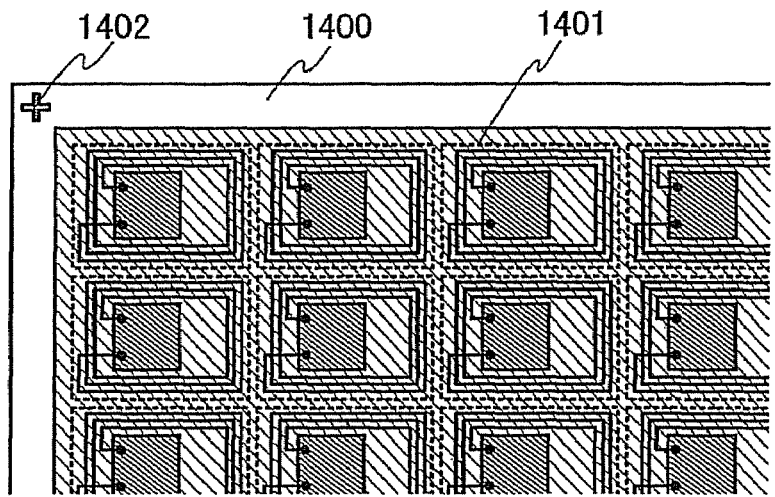
FIGS. 14A to 14C are each a top view of an ID chip 1401.

FIG. 14A is a top view of an ID chip 1401 before an inspection process. The ID chip 1401 is formed on a substrate 1400 and a maker 1402 is also formed on the same substrate 1400. The ID chip 1401 can be aligned with the maker 1402 as a reference in an inspection.

Figure 14B:
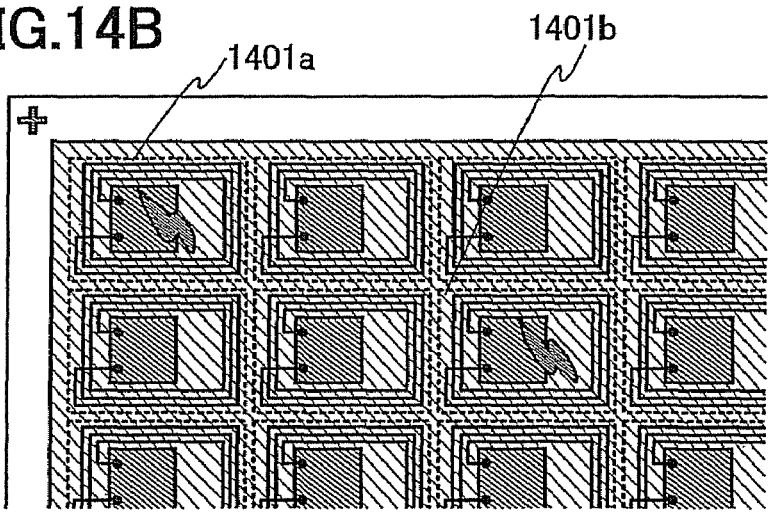

For example, as shown in FIG. 14B, ID chips 1401a and 1401b among the ID chips 1401 are regarded as defectives after the inspection. In this case, marks are made by an ink or a laser in order to distinguish the ID chips 1401a and 1401b visually from the others.

Figure 14C:
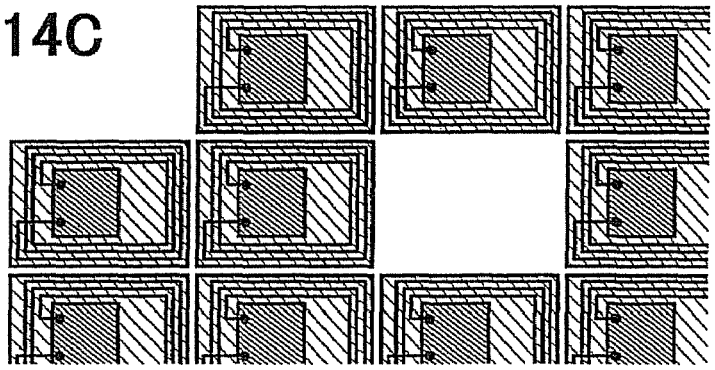

As shown in FIG. 14C, ID chips 1401 are isolated and separated from the substrate 1400. After that, the defective ID chips 1401a and 1401b are taken out and removed from the lot.

This embodiment can be freely combined with any of Embodiments 1 to 4.

Embodiment 6

Figure 15A:
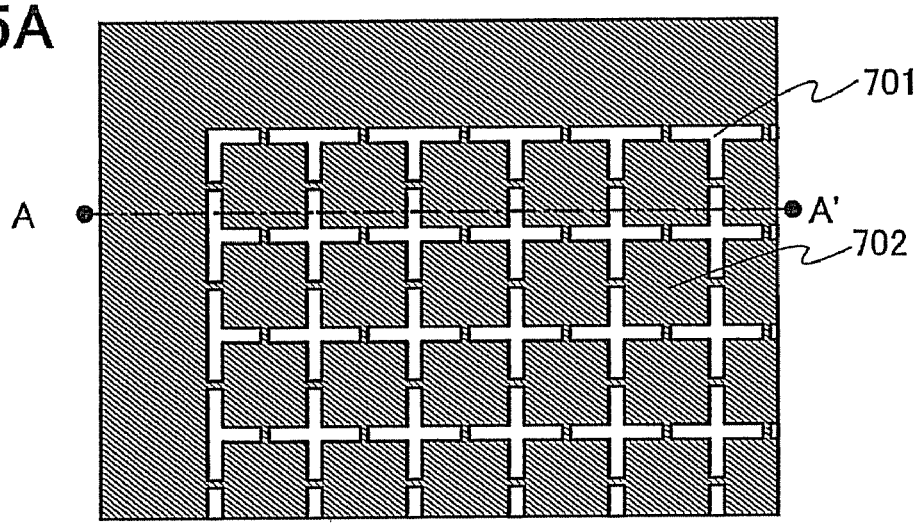
FIGS. 15A to 15D each show a shape of a groove formed in separating a plurality of integrated circuits formed on one substrate.
Figure 15B:
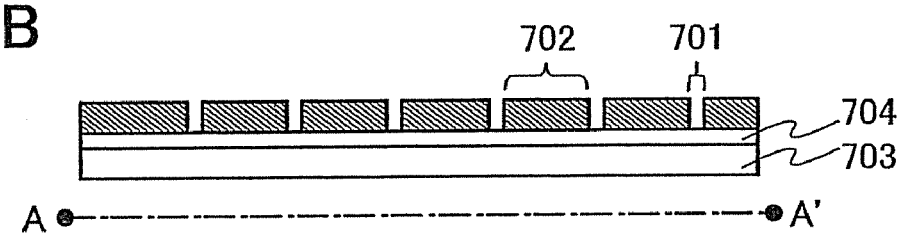

Embodiment 6 describes a shape of a groove to be formed when separating a plurality of integrated circuits are formed on one substrate. FIG. 15A is a top view of a substrate 703 over which grooves 701 are formed. FIG. 15B is a sectional view taken along A-A' of FIG. 15A.

The integrated circuits 702 are formed over a separation layer 704 which is formed on the substrate 703. The groove 701 is formed between the thin film integrated circuits 702 and formed deep enough to expose the separation layer 704. In this embodiment, the plurality of thin film integrated circuit 702 are not completely but partially isolated by the grooves 701.

Figure 15C:
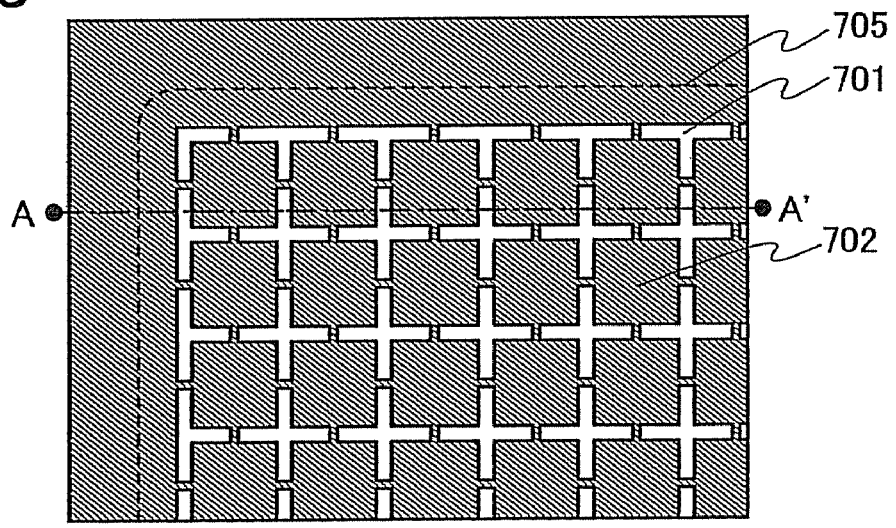
Figure 15D:
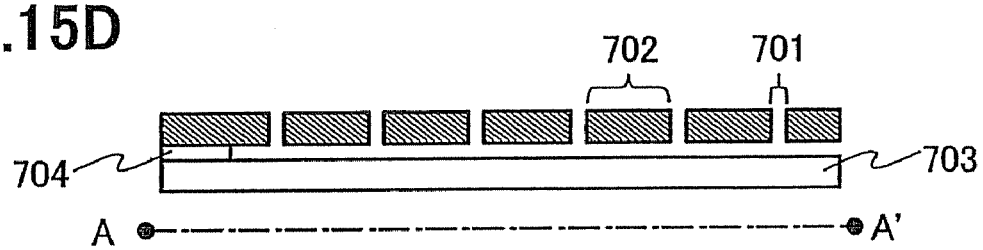

Next, FIGS. 15C and 15D show the substrates after flowing etching gas into the grooves shown in FIGS. 15A and 15B to remove the separation layer 704 by etching. FIG. 15C corresponds to a top view of the substrate 703 on which the grooves 701 are formed. FIG. 15D corresponds to a sectional view taken along A-A' of FIG. 15C. It is assumed that the separation layer 704 is etched from the groove 701 to a region denoted by a broken line 705. The plurality of thin film integrated circuit 702 are not completely but partially isolated by the grooves 701 and are partially connected to each other as shown in FIGS. 15C and 15D. Therefore, it is possible to prevent each of the thin film integrated circuit 702 from moving by losing the support after etching the separation layer 104.

After the states shown in FIGS. 15C and 15D are formed, the integrated circuits 702 are separated from the substrate 703 by using a tape attached with an adhesive agent, a substrate or the like, which is prepared separately. The plurality of thin film integrated circuit 702 which have been separated are attached onto the support medium before or after being isolated from each other.

This embodiment describes an example of a manufacturing method of an ID chip. A manufacturing method of an ID chip according to the present invention is not limited to the structure described in this embodiment.

This embodiment can be freely combined with any of Embodiments 1 to 5.

What is claimed is:

1. A method for manufacturing a semiconductor device comprising:

forming at least a first thin film transistor and a second thin film transistor over a substrate;

forming at least a first antenna and a second antenna over the substrate, the first antenna being on and electrically connected to the first thin film transistor, and the second antenna being on and electrically connected to the second thin film transistor;

placing the substrate between a first support medium having at least first and second inspection antennas and a second support medium having inspection electrodes, so that the first antenna and the second antenna are located over the first inspection antenna and the second inspection antenna, respectively, with the substrate interposed therebetween;

supplying a signal or power supply voltage to the first and second antennas via the first and second inspection antennas without contact with the first and second antennas;

moving the inspection electrodes over an arbitrary portion or a whole portion of at least the first and second antennas with a space therebetween;

conducting an inspection for grasping a first operating state of the first thin film transistor and the first antenna from a first voltage of the inspection electrodes and a first position of the inspection electrodes with respect to the first antenna, and a second operating state of the second thin film transistor and the second antenna from a second voltage of the inspection electrodes and a second position of the inspection electrodes with respect to the second antenna;

separating the first thin film transistor with the first antenna and the second thin film transistor from the substrate; and attaching at least one of the first thin film transistor and the first antenna to a third support medium.

2. The method for manufacturing a semiconductor device according to claim 1, wherein the substrate is an insulator.

3. The method for manufacturing a semiconductor device according to claim 1, wherein the substrate is a glass substrate or a plastic substrate.

4. The method for manufacturing a semiconductor device according to claim 1, wherein the spaces are controlled by flowing a fluid thereinto.

5. The method for manufacturing a semiconductor device according to claim 1, wherein an inspection method by voltages applied to the first and second antennae are calculated by a method of successive approximation, a Fourier transform method using a projection slice theorem, or a convolution theorem method to grasp the first and second operating states is employed.

6. The method for manufacturing a semiconductor device according to claim 1, wherein the inspection electrodes are rotated.

7. The method for manufacturing a semiconductor device according to claim 1, wherein further comprising a step of forming an insulating film over the first thin film transistor, wherein then the first antenna is formed over the insulating film.

8. A method for manufacturing a semiconductor device comprising:

forming a first thin film transistor and a second thin film transistor over a substrate;

forming a first antenna on the first thin film transistor and a second antenna on the second thin film transistor over the substrate, the first antenna being electrically connected to the first thin film transistor, and the second antenna electrically connected to the second thin film transistor;

placing the substrate between a first support medium having first and second inspection antennas and a second support medium having first and second inspection electrodes so that the first antenna and the second antenna are located over a first inspection antenna and a second inspection antenna respectively, with the substrate interposed therebetween;

supplying a signal or power supply voltage to the first and second antennas via the first and second inspection antennas without contact with the first and second antennas;

moving first and second inspection electrodes with an arbitrary portion or a whole portion of the first and second antennas with a space therebetween;

conducting an inspection for grasping a first operating state of the first thin film transistor and the first antenna from a first voltage of the first inspection electrode and a first position of the first inspection electrode with respect to the first antenna, a second operating state of the second thin film transistor and the second antenna from a second voltage of the first inspection electrode and a second position of the first inspection electrode with respect to the second antenna, a third operating state of the first thin film transistor and the first antenna from a third voltage of a second inspection electrode and a third position of the second inspection electrode with respect to the first antenna, a fourth operating state of the second thin film transistor and the second antenna from a fourth voltage of the second inspection electrode and a fourth position of the second inspection electrode with respect to the second antenna, separating the first thin film transistor with the first antenna and the second thin film transistor from the substrate; and attaching at least one of the first thin film transistor and the first antenna to a third support medium.

9. The method for manufacturing a semiconductor device according to claim 8, wherein the substrate is an insulator.

10. The method for manufacturing a semiconductor device according to claim 8, wherein the substrate is a glass substrate or a plastic substrate.

11. The method for manufacturing a semiconductor device according to claim 8, wherein the spaces are controlled by flowing a fluid thereinto.

12. The method for manufacturing a semiconductor device according to claim 8, wherein an inspection method by which voltages applied to first and second antennae are calculated by a method of successive approximation, a Fourier transform method using a projection slice theorem, or a convolution theorem method to grasp the first, second, third and fourth operating states is employed.

13. The method for manufacturing a semiconductor device according to claim 8, wherein the first and second inspection electrodes are rotated.

14. The method for manufacturing a semiconductor device according to claim 8, wherein further comprising a step of forming an insulating film over the first thin film transistor, wherein then the first antenna is formed over the insulating film.

* * * * *